(12) United States Patent
Carter et al.

(10) Patent No.: US 6,383,724 B1
(45) Date of Patent: May 7, 2002

(54) ORGANIC REMOVAL PROCESS

(75) Inventors: Lawrence E. Carter, Eden Prairie; Steven L. Nelson, Minnetonka, both of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/551,072

(22) Filed: Apr. 18, 2000

Related U.S. Application Data

(63) Continuation of application No. 09/050,703, filed on Mar. 30, 1998, now Pat. No. 6,080,531.

(51) Int. Cl.⁷ .................................................. G03F 7/30
(52) U.S. Cl. ........................................ 430/329; 134/1.3
(58) Field of Search ............................ 430/329; 134/1.3

(56) References Cited

U.S. PATENT DOCUMENTS

| | | | |
|---|---|---|---|
| 4,029,578 A | 6/1977 | Turk ............................ | 210/63 |
| 4,132,637 A | 1/1979 | Key et al. ....................... | 210/7 |
| 4,141,829 A | 2/1979 | Thiel et al. .................... | 210/63 |
| 4,198,296 A | 4/1980 | Doumas et al. ............... | 210/29 |
| 4,555,335 A | * 11/1985 | Burris ......................... | 210/192 |
| 4,885,047 A | 12/1989 | Ury et al. .................... | 156/345 |
| 4,940,808 A | 7/1990 | Schulz et al. ............... | 549/436 |
| 5,071,485 A | 12/1991 | Matthews et al. ............. | 134/2 |
| 5,215,592 A | 6/1993 | Jackson .......................... | 134/1 |
| 5,464,480 A | * 11/1995 | Matthews .................... | 134/1.3 |
| 5,591,349 A | 1/1997 | Ikeda et al. ................. | 210/760 |
| 5,632,847 A | 5/1997 | Ohno et al. .................. | 156/344 |
| 5,676,760 A | 10/1997 | Aoki et al. ..................... | 134/1.3 |
| 5,714,203 A | 2/1998 | Schellenberger et al. ... | 427/378 |
| 5,851,407 A | * 12/1998 | Bowman et al. ............ | 210/759 |
| 5,971,368 A | * 10/1999 | Nelson ....................... | 261/64.3 |

FOREIGN PATENT DOCUMENTS

EP  0 867 924 A2  9/1998

OTHER PUBLICATIONS

JP 11219926 A, De et al, "Removal of Organic Contaminant from Surface of Semiconductor Substrate", JPAB abstract, Oct. 1999.*

JP 2000100749 A, "Multilayer Interconnection Structure Formation Procedure", DWPI abstract, Apr. 2000.*

JP 2000195833 A, "Removing Photoresist from Silicon Wafer", DWPI abstract, Jul. 2000.*

"A Novel Resist and Post–Etch Residue Removal Process Using Ozonated Chemistries", by S. De Gendt, P. et al.

"A New Aqueous Based Technology Employing Subambient Temperature Deionized Water and Ozone for Removing Organics", by R. Matthews, 1998 *Semiconductor Pure Water and Chemicals Conference*, pp. 359–374.

"Nitrate–Induced Photooxidation of Trade Organic Chemicals in Water", by Richard G. Zepp, *Environ. Sci. Technol.* vol. 21, No. 5, 1987, pp. 443–450.

"Oxidation of Polynuclear Aromatic Hydrocarbons in Water. 1. Ozonation", by Fernando J. Beltran et al., *Ind. Eng. Chem. Res.* 1995, 34, pp. 1596–1606.

"Henry's Law Constant For the Ozone–Water System", by J. L. Sotelo et al, *Wat. Res.* vol. 23, No. 10, pp. 1239–1246, 1989.

Comparative Efficiency of Three Systems . . . For the Oxidation of Natural Organic Matter in Water, by H. Allemane, *Ozone Science & Engineering*, vol. 15, pp. 419–432.

"Rate Constants of Reactions of Ozone with Organic and Inorganic Compounds in Water—II", by J. Hoigne et al., *Water Res.* vol. 17, pp. 185–194, 1983.

"The Role of Hydroxyl Radical Reactions in Ozonation Processes in Aqueous Solutions" by J. Joigne et al, *Water Research*, vol. 10, pp. 377–386.

"Rate Constants of Reactions of Ozone with Organic and Inorganic Compounds in Water—I", by J. Hoigne et al, *Water Research*, vol. 17, pp. 173–183, 1983.

"Advanced Oxidation Processes. Test of a Kinetic Model for the Oxidation of Organic Compounds with Ozone and Hydrogen Peroxide in a Semibatch Reactor", by William H. Glaze et al., *Ind. Eng. Chem. Res.* 1989, 28, 1580–1587.

"Oxidation of Polynuclear Aromatic Hydrocarbons in Water. 4. Ozone Combined with Hydrogen Peroxide" by Fernando J. Beltran et al., *Ind. Eng. Chem. Res.* 1996, 35, pp. 891–898.

"Decomposition Kinetics of Ozone in Aqueous Solution" by Young Ku, et al, *Ind. Eng. Chem. Res.*, 1996, 35, pp. 3369–3374.

"Ozonation of Water: Kinetics of Oxidation of Ammonia by Ozone and Hydroxyl Radicals" by Jurg Hoigne et al., *Environmental Science & Technology*, vol. 12, No. 1, Jan. 1978, pp. 79–84.

"Kinetics of Oxidation of Ammonia in Solutions Containing Ozone with or without Hydrogen Peroxide" by Chiang–Hai Kuo, et al *Ind. Eng. Chem. Res.* 1997, 36, pp. 4108–4113.

"Nitroaromatic Hydrocarbon Ozonation in Water. L. Single Ozonation", by Fernando J. Beltran et al, *Ind. Eng. Chem. Res.* 1998, vol. 37, 1998, pp. 25–31.

"Decomposition of Ozone in Water in the Presence of Organic Solutes Acting as Promoters and Inhibitors of Radical Chain Reactions" by Johannes Staehelin et al, *Environ. Sci. Technol.* 1985, vol. 19, pp. 1206–1213.

(List continued on next page.)

*Primary Examiner*—Mark F. Huff
*Assistant Examiner*—Nicole Barreca
(74) *Attorney, Agent, or Firm*—Vidas, Arrett & Steinkraus

(57) ABSTRACT

An improved method of photoresist removal is disclosed in which a treating solution of ozone and bicarbonate or other suitable radical scavengers is used to treat a substrate for use in an electronic device. The method is particularly well suited to photoresist removal where certain metals such as aluminum, copper and oxides thereof are present on the surface of the substrate. The method is also well suited to the removal of other organic materials as well.

26 Claims, 22 Drawing Sheets

OTHER PUBLICATIONS

"tert–Butanol as an OH–Scavenger in the Pulse Radiolysis of Oxygenated Aqueous Systems" by Magnus von Piechowski et al. Ber. *Bunsenges. Phys. Chem.* vol. 96, No. 10, 1992, pp. 1448–1454.

"Ozonation and Peroxone Oxidation of Toluene in Aqueous Solutions" by Chiang–Hai Kuo, *Ind. Eng. Chem. Res.* 1996, Vo. 35, pp. 3973–3983.

"The Chemistry of Water Treatment Processes Involving Ozone, Hydrogen Peroxide and Ultraviolet Radiation" by William Glaze et al, *Ozone Science & Engineering,* vol. 9, pp. 335–352, 1987.

"Degradation of Pesticides by Ozonation and Advanced Oxidation" by R. T. Meijers et al, *Ozone Science & Engineering,* vol. 17, pp. 673–686., 1995.

"Effects of Ozone–Hydrogen Peroxide Combination on the Formation of Biodegradable Dissolved Organic Carbon" by C. Volk et al, *Ozone Science & Engineering,* vol. 15, pp. 405–418, 1993.

"Ozone, Hydrogen Peroxide/Ozone and UV/Ozone Treatment of Chromium And Copper Complex Dyes: Decolorization and Metal Release", by C. D. Adams et al, *Ozone Science & Engineering,* vol. 17, pp. 149–162., 1995.

"Removal of Pesticides by Use of Ozone or Hydrogen Peroxide/Ozone", by P. Roche, *Ozone Science & Engineering,* VO 17, pp. 657–672, 1995.

"Application of Combined Ozone Hydrogen Peroxide for the Removal of Aromatic Compounds From a Groundwater" by J. P. Duguet et al.,, pp. 281–294.

"Nonradical Mechanisms for Peroxide Reactions", *Inorganic Reaction Mechanisms,* pp. 73–89.

"Use of Ozone—Hydrogen Peroxide To Degrade Macroscopic Quantities of Chelating Agents in an Aqueous Solution" by Evan Appelman, et al., *Ind. Eng. Chem. Res.* 1996, vol. 35, pp. 1480–1482.

"Advanced Oxidation Processes, Description of a Kinetic Model for the Oxidation of Hazardous Materials in Aqueous Media with Ozone and Hydrogen Peroxide in a Semibatch Reactor" by William Glaze et al, *Ind. Eng. Chem. Res.,* 1989, vol. 28, pp. 1573–1580.

Christopher Heisig et al, "Decomposition of ozone using carbon–supported metal oxide catalysts", *Applied Catalysis B: Environmental* 14 (1997) p. 117–129.

S.L. Nelson et al., A Process Using Ozonated Water Solutions Sulfonate to Remove Photoresist After Metallization, p. 287–290, 1999.

\* cited by examiner

ORGANIC REMOVAL PROCESS

This application is a continuation application from U.S. application Ser. No. 09/050,703, filed Mar. 30, 1998, issued Jun. 27, 2000 as U.S. Pat. No. 6,080,531, the contents of which is hereby incorporated by reference.

FIELD OF THE INVENTION

This invention details an improved method for removing photoresist from microelectronic substrates or other substrates used in electronic devices with solutions of ozone in water. The method provides for faster and more efficient removal of photoresist and other thick organic layers from substrates. The method is especially beneficial for removing photoresist from substrates with exposed aluminum, copper, or other metal lines which inhibit removal of photoresist by solutions containing ozone and water.

BACKGROUND OF THE INVENTION

The ability to transfer microscopic patterns onto semiconductor substrates is essential to device fabrication in the microelectronics industry. The most common method of pattern transfer involves deposition of an organic photoresist onto the substrate. The desired pattern is then transferred to the photoresist by passing light of an appropriate wavelength through a mask with the desired pattern. Once the photoresist is exposed, a portion of it is selectively removed to complete transfer of the pattern. In the positive photoresists typically used in current processes, the exposed portion of the photoresist is selectively removed by a solvent.

After transfer of the pattern, the photoresist remaining on the substrate acts as a mask to allow selective processing of the underlying substrate. This subsequent processing can include implantation of dopant atoms or etching of the underlying substrate material.

Once this processing is complete, the remaining photoresist material on the substrate must be completely removed prior to beginning the next series of process steps. Several techniques are currently used for this removal. Aqueous mixtures of sulfuric acid and hydrogen peroxide at temperatures of 80° C.–150° C. effectively remove most post process photoresist residues. When the underlying substrate includes metal lines, however, these mixtures are not suitable as they will damage the metal lines. Various organic solvents, such as N-methyl-pyrrolidone (NMP), may be used to remove the undesired photoresist without harming the metal lines. However, these solvents tend to pose both safety and health hazards. Also, solvents are generally expensive and incur high disposal costs. Oxygen ashers, which use microwave energy to create an oxygen plasma to remove the photoresist, provide an alternative' method for photoresist removal. However, this method typically does not leave the surface in a suitably clean state for subsequent processing, thus requiring an additional step to finish the substrate cleaning. Additionally, the harsh environment within the asher has the potential to damage the substrate.

Mixtures of sulfuric acid and ozone have also been employed for the removal of photoresist. Sulfuric acid and ozone are used to strip photoresist in a wet bench with a recirculation system for the sulfuric acid. The resist is partially oxidized by the sulfuric acid and removed from the substrate into solution thereby contaminating the sulfuric acid. Ozone is bubbled through the sulfuric acid to finish the breakdown of the photoresist in order to clean the sulfuric acid so that the sulfuric acid can be reused.

An alternative to the above photoresist removal methods is the use of ozone as the primary chemical agent for photoresist removal. Although gas phase ozone may be used for removal of photoresist and other organics, ozonated water has several advantages over gas phase ozone when liquid water may be used in the processing environment. In a completely gas phase process, the ozone must react with the organic contaminants until the resulting molecules are volatile in the gas phase. In aqueous solution, however, it is only necessary to react ozone with the organics until the resulting molecules are soluble and can be transported away by diffusion or by mechanical rinsing. The latter task is generally easier to accomplish, leading to more effective organic removal with solutions of ozone in water.

Use of ozonated water is an attractive method of photoresist removal as it eliminates many of the problems of the traditional photoresist removal methods. Solutions of ozone in water are easy and relatively inexpensive to make at the point of use. Because the ozone in the water eventually breaks down into molecular oxygen, ozonated water does not require as many of the special disposal techniques needed for the other liquid phase removal methods. It is also suitable as a one step clean and it is compatible with all of the substrates commonly exposed during microelectronic fabrication.

In a more general sense, ozonated water is suitable for a variety of organic removal applications of which photoresist removal is but one example. Solutions of ozone in water will react with a wide variety of organic materials. Generally, ozone will react directly with molecules containing carbon-carbon double bonds, carbon-carbon triple bonds, carbon-oxygen bonds, or carbon-nitrogen bonds. Direct reaction implies that the ozone does not pass through a reaction intermediate when reacting with the above molecules. Direct ozone reactions with compounds containing only carbon and hydrogen or compounds containing aromatic rings, such as benzene and phenol, are relatively slow. Ozone reactions with these compounds usually involve an indirect reaction mechanism, implying that the ozone molecule is first converted into another species prior to reaction, such as an OH radical. Common photoresists generally contain a wide variety of functional groups, including carbon-carbon multiple bonds and carbon-heteroatom bonds. As a result, ozone reacts quickly with photoresist via direct reactions.

U.S. Pat. No. 5,464,480 by Matthews details a process for increasing the concentration of ozone for use in removing thick organic layers such as photoresist. The increased ozone concentrations are achieved by reducing the temperature of the water during the dissolution of the ozone gas into the water, thus increasing the solubility of the ozone gas in the water.

While ozonated water will not damage typical substrates, it is not universally effective for removing photoresist or other organic materials under all conditions. The presence of exposed metal lines such as aluminum or copper lines in the underlying substrate, has been observed to inhibit the effectiveness of ozone in aqueous solution as a photoresist removal agent.

It is a goal of the present invention to provide a method for the enhanced removal of photoresist and other organic materials from the surface of a substrate for use in an electronic device. It is a further goal of the present invention to provide a method for the removal of photoresist and other organic materials from the surface of a substrate in the presence of metals such as copper and aluminum on the surface of the substrate.

SUMMARY OF INVENTION

The method provides an improved process for removing photoresist or other organic materials from a substrate. In the method, bicarbonate ions or carbonate ions are added to ozonated deionized water resulting in faster removal of undesired photoresist or other organic materials. The concentration of bicarbonate or carbonate ion in treating solution is suitably approximately equal to, or greater than, the ozone concentration. Preferably, the bicarbonate or carbonate ion concentration will be greater than the ozone concentration by an order of magnitude or more. Bicarbonate ions may be introduced into the ozonated water by addition of ammonium bicarbonate ($NH_4HCO_3$) or by other suitable means. The method is effective in enhancing photoresist removal rates at all pH values for which bicarbonate or carbonate ions exist in solution in significant quantities. The method is also particularly effective where the substrate has accessible lines (i.e. exposed or exposable during a photoresist or organic removal process) of certain metals such as aluminum, aluminum oxide, copper and copper oxide or other radical inducers on at least a portion thereof.

In another embodiment, the method provides a process of removing organic material from a substrate for use in an electronic device. The method comprises treating a substrate having exposed areas of organic material with a treating solution comprising a carrier solvent, ozone, and a radical scavenger which is effective at the pH of the treating solution. The method is also particularly effective where the substrate has exposed lines of certain metals such as aluminum, aluminum oxide, copper and copper oxide or other radical inducers. The radical scavenger consumes radicals produced by decomposition of ozone, thus preventing any chain reaction which might further reduce the ozone concentration.

The method may be practiced by placing the substrate in a process chamber, optionally controlling the gas-phase environment in the process chamber and treating the substrate with a treating solution comprising a carrier solvent, ozone, and a radical scavenger and/or bicarbonate ions.

DETAILED DESCRIPTION OF EMBODIMENTS

Figure 1:
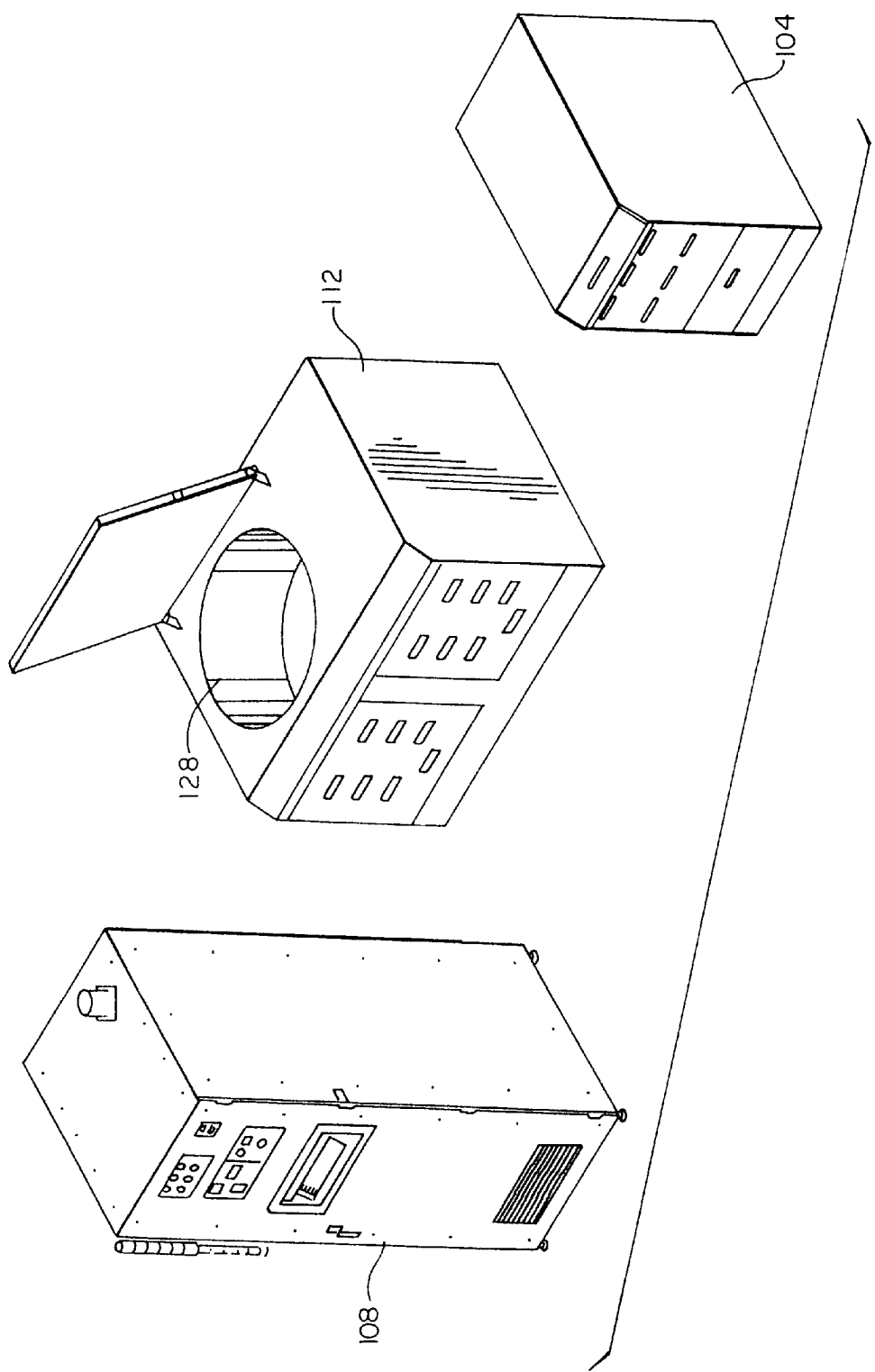
FIG. 1 is a schematic of the experimental apparatus used to practice the present method.

The method detailed herein is an improvement over standard methods for removing organic material with ozonated water. The improved ozonated water method provides faster removal of photoresist or other organic materials. Additionally, the method is particularly effective for removing photoresist or organic material from substrates containing exposed metal lines, such as aluminum or copper lines. In standard ozonated water processes, the removal rate of photoresist drops dramatically in the presence of such lines. The method, however, maintains high rates of removal even in the presence of such metal lines.

The method provides for addition of a radical scavenger such as bicarbonate ions to the ozonated water. Introduction of an appropriate radical scavenger at appropriate concentration allows for effective removal of organic material from all substrates tested, including those with exposed aluminum or copper lines on the surface.

Without being restricted to any particular theory, it is believed that ozone reacts with photoresist via a direct reaction. As described above, this implies that the ozone molecules react directly with the photoresist without passing through a reactive intermediate, such as an OH radical. Any radicals which do form are likely to participate in reactions not associated with photoresist removal, so for our process radical formation is undesirable. It is believed that the conditions present at the surface of the substrates are conducive to the formation of radicals. This is particularly true when metal lines, such as aluminum or copper lines, are present on the substrate. These metal lines appear to catalyze the reaction which leads to creation of OH radicals via destruction of ozone. It is further believed that the reaction between ozone and the metal lines is fast, so a large number of the ozone molecules which impinge on such metal lines are likely to decompose to yield OH radicals.

OH radicals, in turn, will react with many substances including ozone molecules. Staehelin and Hoigne (Environmental Science and Technology, Vol. 19, p 1206–1213, 1985) report that at pH values above 4, OH radicals will react with $O_3$ to yield the superoxide ion, $O_2^-$. $O_2^-$ will then selectively and rapidly react with another $O_3$ molecule in solution, eventually producing several products including another OH radical. Thus, in the presence of a large number of OH radicals, a self-sustaining chain reaction can occur which can rapidly reduce the amount of ozone available in solution. When attempting to remove photoresist with ozonated water from a substrate with exposed aluminum lines this type of chain reaction can drastically lower the photoresist removal rate due to the greatly reduced amounts of available ozone.

Specifically, ozone is thought to break down according to the reaction path:

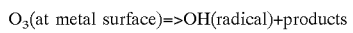

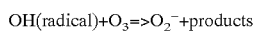

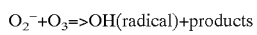

The above reaction scheme allows OH radicals to destroy two ozone molecules per reaction cycle with no net consumption of OH radicals. Termination reactions may lead to the destruction of radicals, such as the combination of two OH radicals to form HOOH. However, in standard ozonated water solutions it is believed that many ozone molecules will be destroyed per initial OH radical prior to such a termination step.

The increase in organic removal efficiency that is observed on addition of bicarbonate ions to ozonated solutions is believed, on the basis of the above reaction scheme, to result from bicarbonate ions acting as radical scavengers. Specifically, bicarbonate ions do not inhibit the reaction between ozone molecules and the aluminum surfaces, as any ozone molecules which interact directly with an exposed aluminum surface will still be destroyed. Rather, bicarbonate ions prevent the resulting OH radicals from starting a chain reaction which consumes the vast majority of the solvated ozone. As such, other radical scavengers such as acetone, acetic acid, $HPO_4^{2-}$ (hydrogen phosphate ion) and salts thereof, $H_3PO_4$, $NH_4H_2PO_4$, $(NH_4)_2HPO_4$, salts of $H_2PO_4^-$, salts of $PO_4^{3-}$ and alkanes should also be effective for maintaining high photoresist removal rates, in particular when aluminum or other metal lines or structures are present on the substrate surface. As with bicarbonate or carbonate ions, the effectiveness of these radical scavengers varies depending on the reaction conditions, including pH, temperature, and the relative concentrations of the scavenger and the radicals.

While the method calls for the use of a radical scavenger, the radical scavenger must not be one that reacts with radicals to form other radicals or peroxides in high enough quantities to appreciably degrade ozone. In the case of t-butanol, although OH radicals are initially consumed in the reaction, at high OH radical concentrations the resulting molecule falls apart into a variety of products, including $H_2O_2$, $O_2^-$, and various organic peroxides (von Piechowski et al., International Journal of Physical Chemistry: Berichte der Bunsen-Gesellschaft, vol. 96, No. 10, p 1448–1454, 1992) which are effective for causing subsequent $O_3$ breakdown. It is thus believed that this decomposition reaction is responsible for the difference in behavior of bicarbonate ion and t-butanol as radical scavengers with t-butanol losing its effectiveness at high radical concentrations. A similar reaction sequence may also prevent alkanes from being effective at high OH radical concentrations.

The bicarbonate ions used in the method may be derived from salts of bicarbonate ions including $NH_4HCO_3$, salts of carbonate ions, dissolved $CO_2$ in solution, or combinations of these bicarbonate ion sources. In practical terms, salts which include metals such as sodium are not acceptable for semiconductor applications, as this could lead to deposition of trace levels of metals on the semiconductor substrate. Thus, ammonia and other non-metallic cations are preferred as the counter-ion when the source of bicarbonate ions is a salt of bicarbonate or carbonate. However, this restriction arises only due to the substrate, so in situations where the presence of trace levels of metals on the substrate is not a concern, the method will work with sources of bicarbonate ions which are salts containing metallic counter-ions. In the case of dissolved $CO_2$, the $CO_2$ combines with water to form $H_2CO_3^-$. $H_2CO_3^-$ will dissociate into $HCO_3^-$ and H+, and at pH values greater than 7 the equilibrium lies heavily in favor of $HCO_3^-$ and H+. The $CO_2$ may be introduced into the water by any convenient method, including bubbling $CO_2$ gas through the ozonated water. Other substances such as the above mentioned radical scavengers acetone, acetic acid, $HPO_4^{2-}$ (hydrogen phosphate ion) and salts thereof, $H_3PO_4$, $NH_4H_2PO_4$, $(NH_4)_2HPO_4$, salts of $H_2PO_4$, salts of $PO_4^{3-}$, alkanes are also contemplated in place of or in addition to the bicarbonate ions.

The efficiency of the method is pH dependent. At pH values above 9, the equilibrium between carbonate ion and bicarbonate ion starts to shift toward the carbonate form. Although the method has been employed successfully at pH values as high as 9.5, care must be exercised to avoid using solutions with excessively high pH values for several reasons. First, an excessively high pH value e.g. a pH in excess of 10, results in faster etching of $SiO_2$, leading to the possibility that exposed surfaces of $SiO_2$ could potentially be etched and damaged. Second, excessively high pH values also lead to faster breakdown of ozone in solution. Because $OH^-$ ions can induce ozone decomposition, the lifetime of ozone in solution may be too short for practical application at pH values above 10. Finally, generating a pH value above 10 requires the use of a relatively strong base. Because strong bases which contain metals (NaOH, KOH) are not acceptable in standard semiconductor processes, ammonium hydroxide is often used as the base. Ozone, however, is known to react with ammonia, and this reaction could lead to significant destruction of ozone if the concentration of ammonia or ammonium ion is well above 1 M.

At low pH values, the effectiveness of the method is reduced. The dissociation constant for the equilibrium between carbonic acid and bicarbonate ion is $4.45 \times 10^{-7}$, which is equivalent to a pKa of 6.35. At acidic pH values, bicarbonate ions protonate forming carbonic acid. (As the pH of the solution decreases the carbonate ion concentration becomes negligible.) Whereas the ratio of bicarbonate ions to carbonic acid is 1:1 at pH 6.35, at pH 5.35 the ratio decreases to 10:90 and at pH 4.35 the ratio is lower yet, 1:99. As the pH drops, it becomes increasingly difficult to maintain a high concentration of bicarbonate ions. Because the method requires a concentration of bicarbonate or carbonate ions which is at least comparable to the concentration of ozone in solution, the practice of the method using bicarbonate at pH values significantly below 4 becomes difficult.

In order to practice the method at a desired pH, the pH of the treating solution may be adjusted by adding a suitable acid such as HF or a suitable base, such as $NH_4OH$, to the treating solution. It is desirable for the pH of the treating solution to be between about 5 and about 10. It is more desirable for the pH of the treating solution to be between about 7 and about 8.5. It is most desirable for the pH of the treating solution to be between about 7.1 and about 7.8. In the case where the method is carried out in a wet bench, with the substrate immersed in the treating solution, it is desirable for the pH of the treating solution to be maintained within the above-mentioned ranges. As such, any suitable acid or base which is compatible with the substrate being treated may be used to maintain the pH of the treating solution within the desired range.

The pH restrictions for use of phosphate ion sources, such as $NH_4H_2PO_4$, are slightly different. The $HPO_4^{2-}$ ion is the actual radical scavenger for this series of radical scavenger sources. The pKa for the dissociation of $H_2PO_4^-$ to $HPO4^{2-}$ is 7.20. The pKa for dissociation of $HPO_4^{2-}$ to $PO_4^{3-}$ is 12.38. As a result, the appropriate pH range for generating $HPO_4^{2-}$ ions from sources of phosphate ions is between 6 and 13. As was the case with the bicarbonate/carbonate system, however, pH values above 10 may be impractical due to other considerations.

The concentration of ozone in the carrier solvent should be greater than $1\times10^{-4}$ M. Preferably, the total concentration of radical scavengers, such as bicarbonate and/or carbonate ions, in the treating solution is at least 1.5 times and desirably between 5 times and 20 times the concentration of ozone in the treating solution. Lower concentrations of scavenger will work, but the amount of improvement will be slowly diminished as the concentration of scavenger falls below the concentration of ozone in solution. However, even concentrations of radical scavenger which are an order of magnitude lower than the ozone concentration should still provide some improvement over standard ozone processes. Greater concentrations of radical scavenger will also work. Thus, concentrations of radical scavenger which are 100 times as great as the ozone concentration or greater will also be effective.

Preferably, the temperature of the treating solution will be between 16° C. and 25° C. However, this preference is due to the preferred method of introducing ozone into solution. The method will work at any temperature where a sufficient concentration of ozone can be placed in a deionized water solution and as such may be performed at temperatures of treating solution ranging from 0° C. to 100° C.

The amount of $O_3$ and $CO_2$ which stays dissolved in the treating solution may be enhanced by controlling the gas phase environment above and/or around the treating solution. High gas-phase concentrations of $O_3$ and $CO_2$ will both increase the equilibrium concentration values for saturated solutions of $O_3$ and $CO_2$ as well as reduce the rate of outgassing of $O_3$ and $CO_2$ if the treating solution is supersaturated. Preferably, the gaseous atmosphere will comprise $N_2$, $O_2$, $O_3$, $CO_2$ and combinations thereof.

Although the method may be used to remove photoresist from silicon substrates, it may be applied more generally to remove other organic materials including polymers used in the preparation of inter-layer dielectrics. Further, the method has application in the removal of photoresist or other organic material from other substrates such as silicon oxide, gallium arsenide, conductive glass including indium tin oxide (ITO) coated glass, and ceramic substrates. These materials may find use in a variety of devices, including microelectronic circuits, printed circuit boards, thin film heads, flat panel displays and magnetic storage disks for memory devices such as computer hard drives.

Additionally, the method may be performed in a one-step process or may be repeated as often as necessary as part of a multiple-step process. Further, the method may be used in conjunction with other compatible methods of photoresist or organic material removal, whether known or unknown at present or as a step in a general multistep substrate processing sequence.

The methods may be implemented in any of the wet processing tools currently in use in the semiconductor industry. In a preferred embodiment, the method is carried out in a spray tool similar to the one described below, although other tools may be used such as the wet benches common to every fabrication plant, the full-flow devices detailed in U.S. Pat. No. 4,984,597 to McConnell, single wafer vapor processing tools which include liquid rinse capabilities such as the Excalibur™ tool sold by FSI™, Inc. and single wafer wet processing tools such as the tool made by SEZ (Villach, Austria).

An apparatus particularly suited for practice of the method is the FSI MERCURY® MP process tool. The basic features of the MERCURY® MP process tool are disclosed in U.S. Provisional Patent Application Ser. No. 60/008,848 filed Dec. 19, 1995, and U.S. patent application Ser. No. 08/768,447 filed Dec. 18, 1996, both of which are incorporated herein by reference as well as in U.S. Pat. No. 3,990,462 to Elftmann et al. also incorporated herein by reference. The spray process tool, shown schematically in FIG. 1, consists of three major assemblies that are relevant to the method, a canister console 104, an electronics console 108, and a wafer process console 112.

Figure 2:
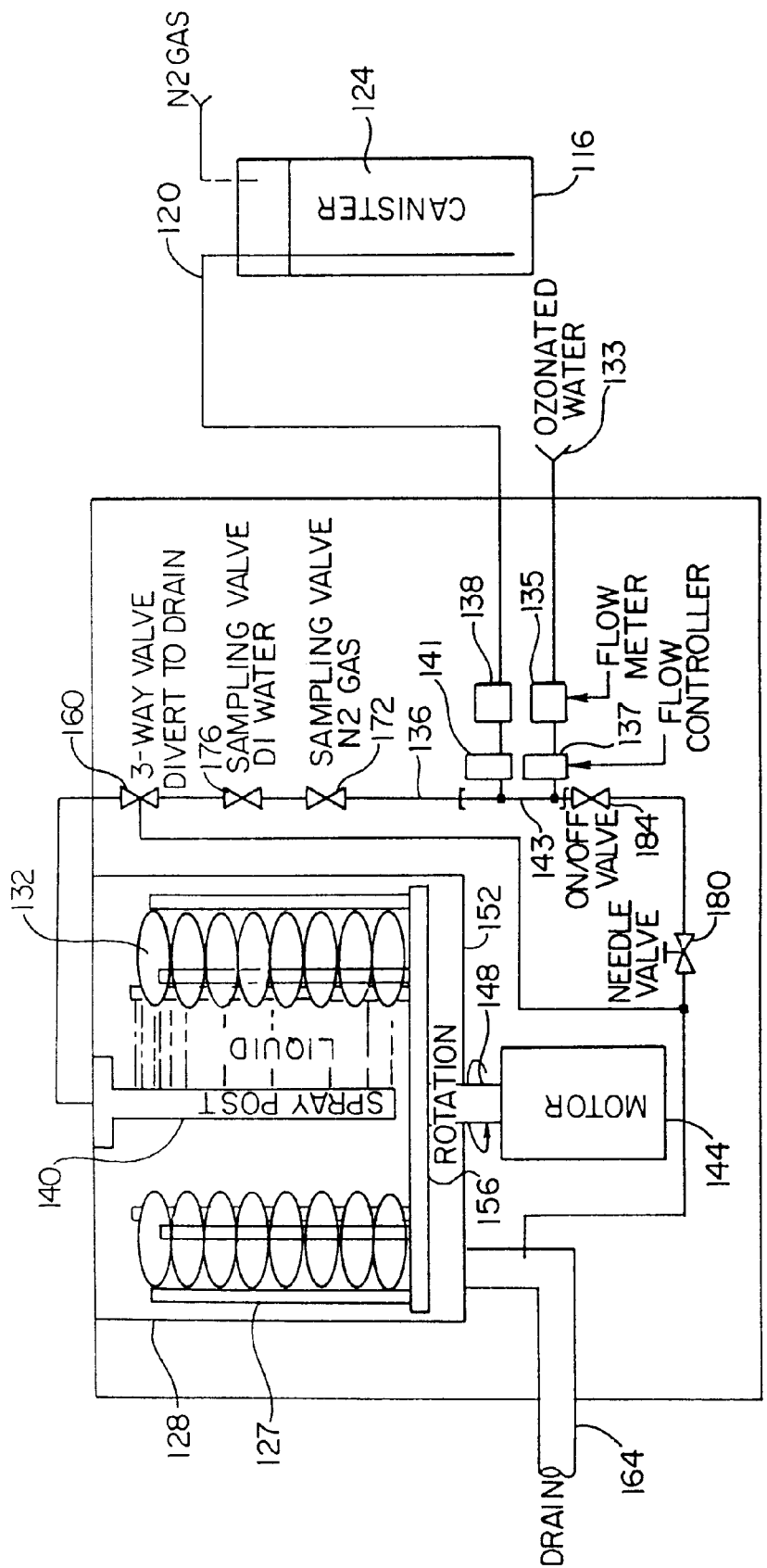
FIG. 2 is a schematic diagram of the apparatus used to practice the present method.

The canister console 104 contains three cylindrical canisters (not shown in FIG. 1) made of TEFLON™ PFA (PFA is a copolymer of tetrafluoroethylene with a perfluoroalkyl vinyl ether, also commonly referred to as perfluoroalkoxy PTFE.) The canisters are used to store chemicals such as aqueous solutions of bicarbonates and/or other radical scavengers and to deliver the chemicals to the wafer processing assembly. Each canister has an internal volume of 13 liters and has a gas tight cap that is screwed on after the canister has been filled. In the experiments described below, one of these canisters was used to store and deliver chemicals such as bicarbonate ions to the wafer processing assembly where it was mixed with ozonated water and dispensed onto the wafer surface. Prior to dispensing liquid from the chemical canister 116 as shown in FIG. 2, canister 116 was pressurized with 170 kPa of nitrogen gas. A tube 120 extending down to the bottom of canister 116 allows the liquid 124 to be pushed out of the canister by the nitrogen pressure when a downstream valve is opened.

The electronics console 108, the contents of which are not shown, contains a microprocessor that is programmed to control and monitor the operations of the entire system. It also contains pneumatic outputs that control the position of valves in the system. A program, or recipe, may be run from memory by the microprocessor which performs a desired set of steps in sequence.

Finally, the wafer process console 112 contains all the valves that control the flow of the ozonated deionized water, $N_2$ or other gases, and other chemicals. This console also contains the process chamber 128, as shown in FIGS. 1 and 2, where the chemicals are dispensed onto the wafer surface 132. The flow rate of each of these chemicals is programmable in the recipe and is measured and controlled by a flow control system. Ozonated water 133 enters the system and flows through flow meter 135 and flow controller 137 while chemicals flow in from canister 116 through flow meter 139 and flow controller 141. The system further provides for the chemicals and ozonated water to be mixed together in chemical mixing manifold 143 prior to entering the process chamber. After mixing, the chemicals flow through a common tube 136 approximately 5 meters long before entering process chamber 128. Tube 136 terminates in a spray post 140 from which the chemicals are sprayed laterally from a series of perforation onto the wafers 132 which are stacked in a cassette 127. Spray post 140 extends downward in the center of the process chamber such that all the wafers in the cassette may be sprayed with the treating solution.

Process chamber 128 has an internal volume of 125 liters. As shown in FIG. 2, a motor 144 driven shaft 148 comes up through the bottom 152 of process chamber 128. A turntable 156 mounted to a hub (not shown) on the end of the shaft 148 is used in conjunction with motor 144 to spin turntable 156 at a desired integral rotation speed from 10 revolutions per minute (rpm) to 500 rpm.

Optionally, a 3-way valve 160 may be used to divert the initial flow of ozonated water and radical scavenger solutions to the drain 164 while flow stabilizes. This allows for the tubing 136 from the chemical mixing manifold 143 to the divert water valve 160 to fill with ozonated water and radical scavenger solution. After the ozonated water and radical scavenger solution dispense, the line 136 is purged to the drain 164 by again activating this divert valve 160. The combination of the pre and post divert steps allows for better control of the ozonated water and radical scavenger dispense time onto the wafer. This is important for the shorter ozonated water and radical scavenger dispense steps.

Additionally, sampling valves 172 and 176 are used to allow deionized water to rinse the chemical dispense line and $N_2$ gas to purge and dry the chemical dispense line 136, respectively. The sampling valves 172 and 176 allow these rinse and dry operations to occur in both the forward and the backward direction in the chemical dispense line 136 ensuring complete rinsing and drying of the system. A manually adjustable needle valve 180 is provided in the backward flow direction so that the rinse and purge flows can be adjusted to be the same in the forward and backward directions. A 2-way on/off valve 184 is used in the backward direction to prevent the flow of the ozonated water solution in this direction. Valve 184 remains open during the rinsing and drying steps.

In use, after the wafers or substrates are loaded into the process chamber, a lid outfitted to accommodate the spray post is closed and a process program is run that typically dispenses chemicals to react with materials on the wafers, then dispenses water to rinse the wafers and the process chamber, and finally uses nitrogen and rotation at a high rpm to dry the wafers and the process chamber.

While the ozonated water used in the present method may be prepared by any suitable process known in the art, a preferred apparatus for preparing ozonated water for use in the present method is described in co-pending application Ser. No. 08/960277 to Nelson et al. filed Oct. 29, 1997 and incorporated here in its entirety by reference. The Nelson apparatus, shown generally at 200 in FIG. 3, greatly increases the concentration of dissolved ozone in solution by pressurizing the system during adsorption of ozone in the water.

Figure 3:
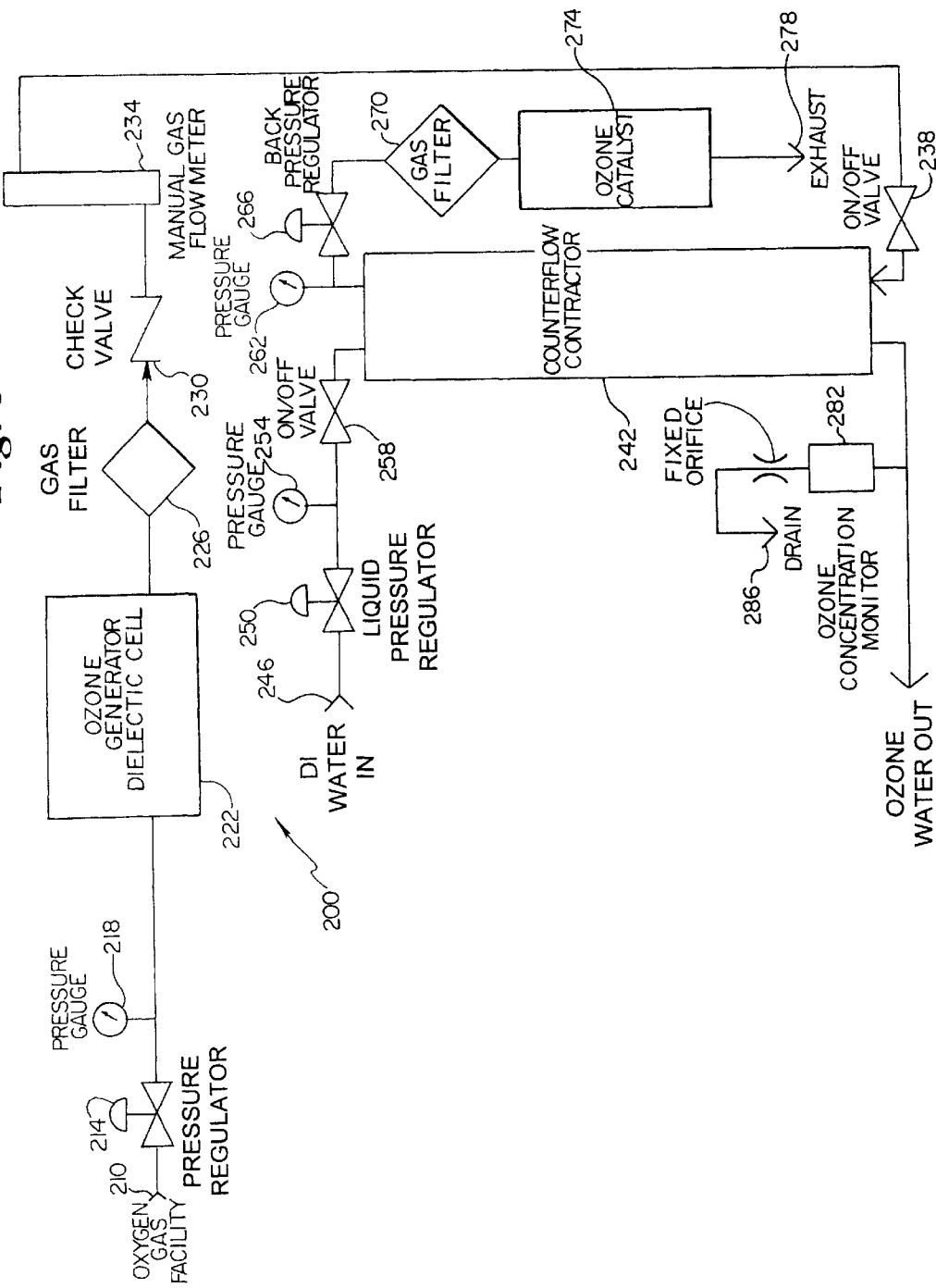
FIG. 3 is a schematic block diagram of an apparatus for ozonating water.

In the apparatus of Nelson, as shown in FIG. 3, oxygen gas flowing from a source 210 regulated by pressure regulator 214 to a pressure of 240 kPa gauge, as measured by gauge 218 flows to an ozone gas generator 222. Inside the generator, oxygen gas, $O_2$, is dissociated by an electric field. About 20% of the oxygen atoms will combine to form ozone gas, $O_3$. This oxygen/ozone gas mixture is filtered with a 0.003 μm TEFLON™ PFA membrane filter 226 and then goes through a check valve 230 a flow meter 234 and a valve 238 and to the gas/liquid contactor 242. The flow of deionized water from source 246 into gas/liquid contactor 242 is regulated by liquid pressure regulator 250 to 205 kPa gauge as measured by gauge 254. The deionized water flows through valve 258 into gas/liquid contactor 242. The gas/liquid contactor, made by W. L. Gore & Associates, Inc. of Elkton Md., consists of small-diameter, thin-wall TEFLON™ PFA tubes through which the deionized water flows while oxygen/ozone gas surrounds and diffuses through the walls of the tubes and dissolves in the water. The oxygen/ozone gas that is not dissolved in the water goes through pressure gauge 262 to a back pressure regulator 266 that maintains a gas pressure in the contactor of 170 kPa gauge pressure. The gas then flows through another filter 270 which prevents back contamination into the gas/liquid contactor, then flows to an ozone catalyst 274, which is made of manganese dioxide, and to the facilities scrubbed exhaust 278. The deionized water that now has ozone gas dissolved in it flows out of gas/liquid contactor 242 and is connected to a flow regulator system 135 and 137 (shown in FIG. 2) in the MERCURY® process console. A sample of some of the liquid is flowed to a dissolved ozone concentration sensor 282 and then flows to a drain 286. The concentration of dissolved ozone in the deionized water is measured to be 40 ppm when 1200 cc/min of ozonated water is drawn from the generator.

Figure 4:
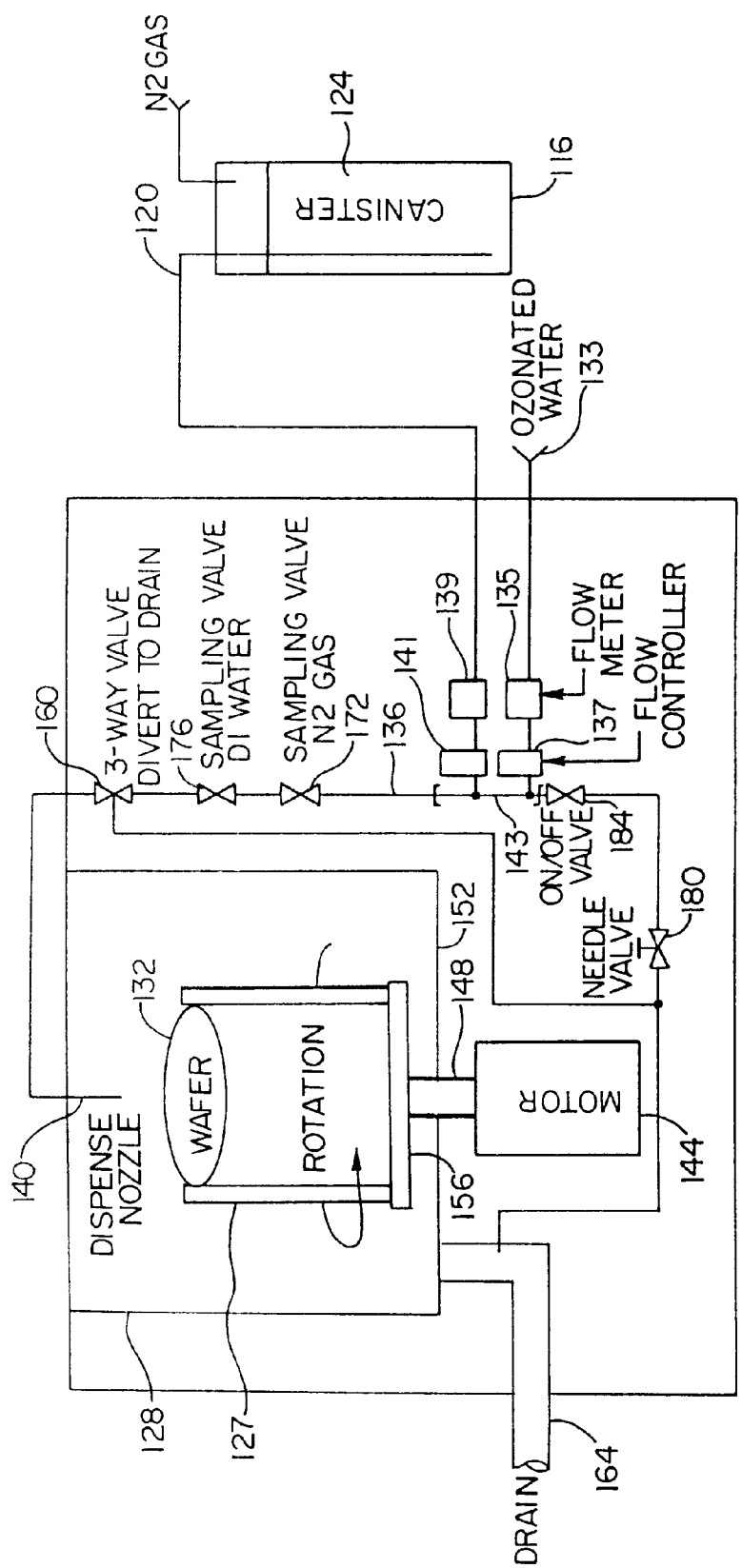
FIG. 4 is a schematic diagram of another apparatus used to practice the present method.

The present method for treating substrates may be better understood by considering the following examples which were carried out using a version of the above described apparatus with a turntable configured for spinning of a wafer 132 in a carrier 127 in the center of the process chamber 128 as shown in FIG. 4. The apparatus of FIG. 4 is identical to that shown in FIG. 2 with two exceptions. First, a different turntable is installed that only holds one cassette of wafers. This turntable holds the wafers in the center of the process chamber and spins on its axis. It can be programmed to spin from 10 rpm up to 999 rpm. Second, treatment solution is sprayed onto wafer 132 from a single nozzle spray post 140 mounted above. These modifications shorten the process time. The center of rotation of wafer 132 in the carrier was 1 cm off axis from the geometric center of the wafer thereby allowing the carrier to be rotated at high speed without the wafer being thrown from the carrier. The wafer carrier was a standard high profile PFA carrier manufactured by Fluoroware, Inc. (Chaska, Minn.) with a hole cut in the center of the top of the carrier. Treatment fluid was dispensed through spray post 140 having a single nozzle with an interior diameter of approximately 0.6 cm directed down at the center of a wafer 132 located in the top of the carrier 127.

All of the experiments discussed below were carried out at a temperature near 20° C. The wafer was rotated at 999 rpm. The dispense time for all flows was controlled by the wafer processing system controller described in the above apparatus description. The total flow of liquid over the wafer was either 1.2 or 1.32 liters per minute. The former number represents the amount of ozonated water delivered by the ozone generator apparatus while the latter number represents the addition of 0.12 liters per minute of additional fluid to the flow. This additional fluid flow, delivered from a canister, provides solutions of the extra treatment chemicals such as ammonium bicarbonate ($NH_4HCO_3$) or t-butanol. Small amounts of ammonium hydroxide ($NH_4OH$) or hydrogen fluoride (HF) were also added in some experiments to provide pH control without introducing new ionic species to the solution. The ozone concentration in the 1.2 liter per minute flow was roughly 40 ppm, or about $8 \times 10^{-4}$ M, while after dilution by the additional 0.12 liter per minute flow the concentration dropped to roughly 36 ppm, or about $7 \times 10^{-4}$ M. For all other chemicals mentioned in the following examples, the reported concentrations represent the values delivered to the wafer surface. Any dilution due to mixing of flows has already been accounted for.

All experiments were run using the following program:

| Step | Duration (seconds) | Rotation rate (rpm) | Action |
|---|---|---|---|
| 1 | 10 | 0 | Pressurize canister with nitrogen. |
| 2 | 45 | 999 | Stabilize chemical flow while diverting to drain, accelerate turntable up to speed. |
| 3 | variable | 999 | Ozone and chemical dispense on wafer. |
| 4 | 8 | 999 | Purge chemicals out of tubing to drain. |
| 5 | 60 | 500 | Deionized water rinse. |
| 6 | 45 | 999 | Dry tubing, flow $N_2$ into chamber to remove $O_3$ gasses. |
| 7 | 13 | 10 | Decelerate turntable to end process. |

Most of the experiments in the following examples were performed using 2.5 cm×2.5 cm square chips cut out of a larger wafer. The initial amount of photoresist on each small chip was roughly equivalent, allowing for straightforward compilation of data from runs on multiple chips. Each chip was attached to a 150 mm dummy wafer by taping the chip to the center of the surface of the dummy wafer. The tape was placed on two opposite edges of the square chip so that the majority of the surface area of the chip remained exposed. The nozzle was aimed at the center of rotation of the wafer at a height roughly 2.5 cm above the surface of the sample chip.

Measurements of photoresist thickness were taken at the center of rotation of the sample chip using a dual-wavelength spectroscopic ellipsometer manufactured by Rudolph Research, Inc. (Flanders, N.J.). Optical constants used in the thickness measurements were either default values provided by the manufacturer (values for photoresist, silicon, and silicon dioxide) or were determined in separate measurements (values for aluminum or copper on a substrate surface). Values plotted in the figures represent the average of 5 measurements taken in close proximity. Each point displayed in the figures represents an individual experiment run for the length of time indicated on the plot. Because the nozzle of the spray post was directed at the center of rotation of the wafer, removal rates at this position on the chip were sometimes higher than for the remainder of the chip. When the removal rate of the photoresist stayed high enough to allow removal of the entire photoresist layer, the photoresist at the center of rotation was often removed prior to the photoresist at other locations on the wafer. Additional experiments were performed in such cases to verify that all of the photoresist could be removed from the chip with only a modest increase in processing time.

For the figures showing the amount of photoresist remaining as a function of time, the collected data points were fit in one of two ways. Graphs which exhibited roughly linear behavior were fit with straight lines whose slopes corresponded to the rate of photoresist removal. All remaining graphs were fit with a cubic spline and the removal rates calculated by interpolating between points on the cubic spline fit.

Comparative Example 1

Figure 5A:
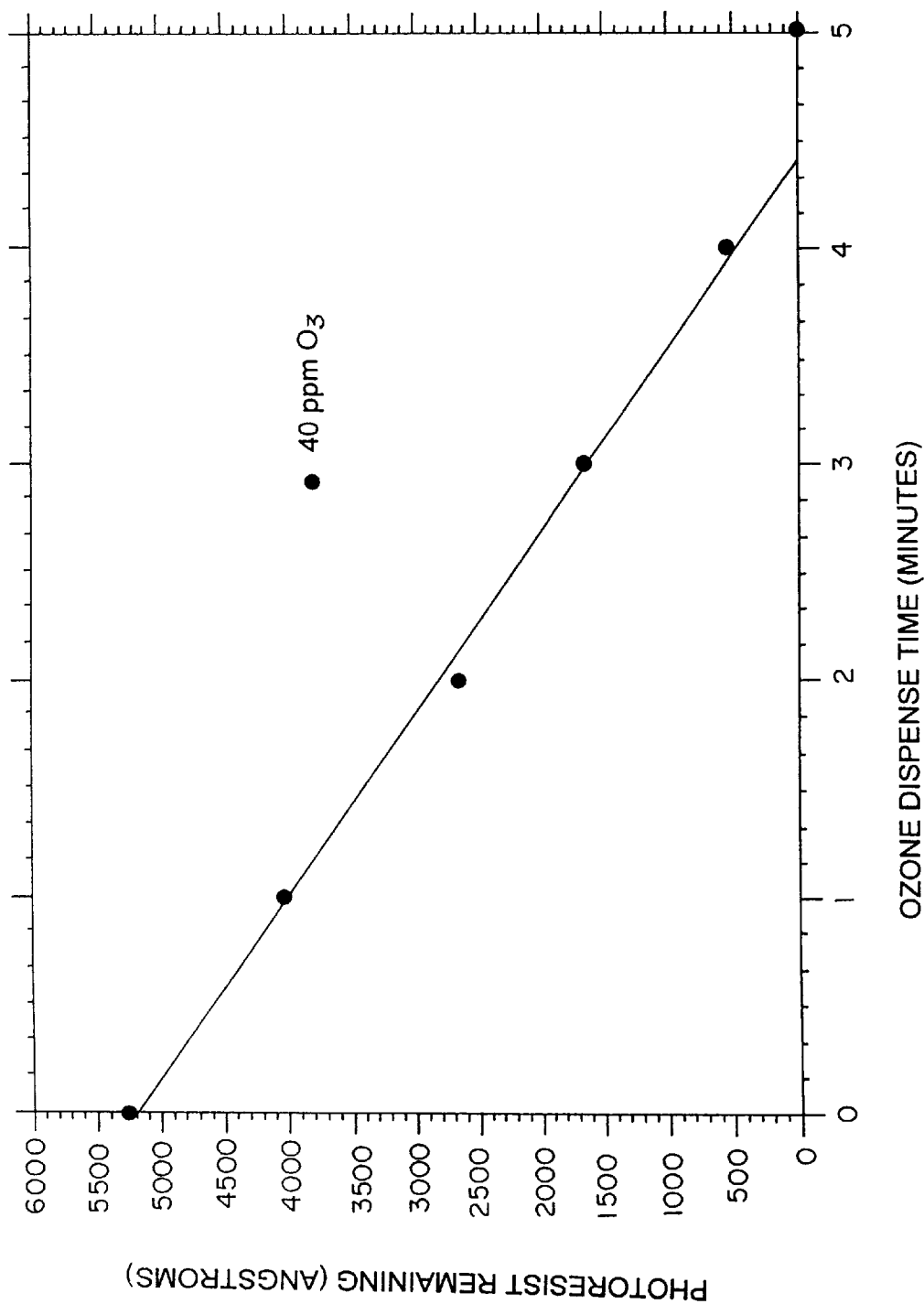
FIG. 5a is a plot showing the amount of photoresist removal from a substrate as a function of time in accordance with Comparative Example 1.
Figure 5B:
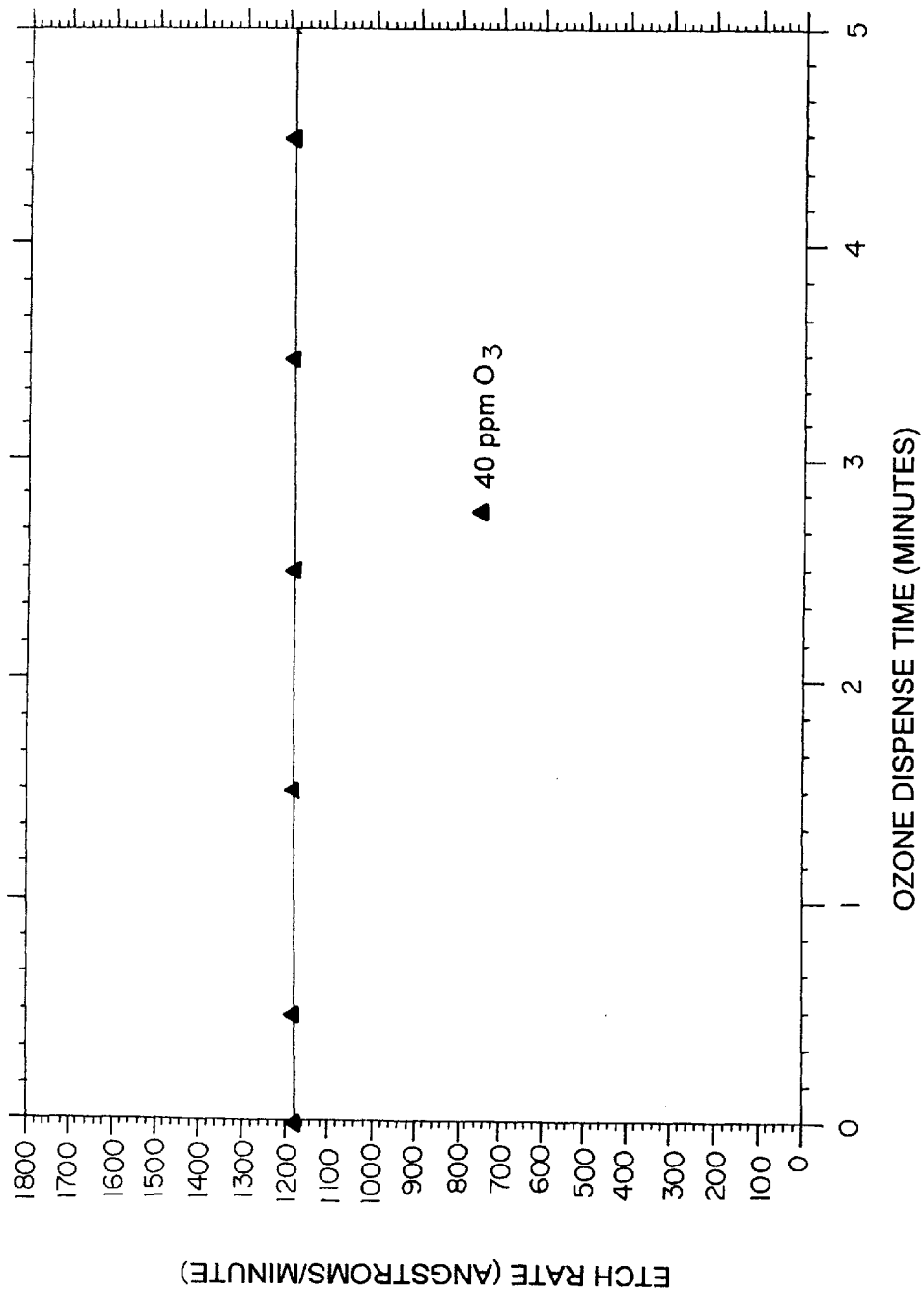
FIG. 5b is a plot showing the photoresist removal rate from the substrate of FIG. 5a as a function of time.

This first comparative example provides baseline experiments for removal of photoresist with water containing 40 ppm of ozone. FIG. 5a shows the amount of photoresist remaining on the surface as a function of time for a blanket layer of hard-baked photoresist on silicon. As these materials are readily available and relatively inexpensive, full 150 millimeter wafers were used for these experiments. The wafers consisted of approximately 0.5 micrometers of hard-baked resist on a bare silicon wafer. During the experiments, the wafers were treated with 1.2 liters per minute of water containing 40 ppm of ozone. Due to the nature of the apparatus, fresh ozonated water was constantly brought into contact with the surface, leading to the effectively constant rate of resist removal indicated in FIG. 5b.

Inventive Example 1

Figure 6A:
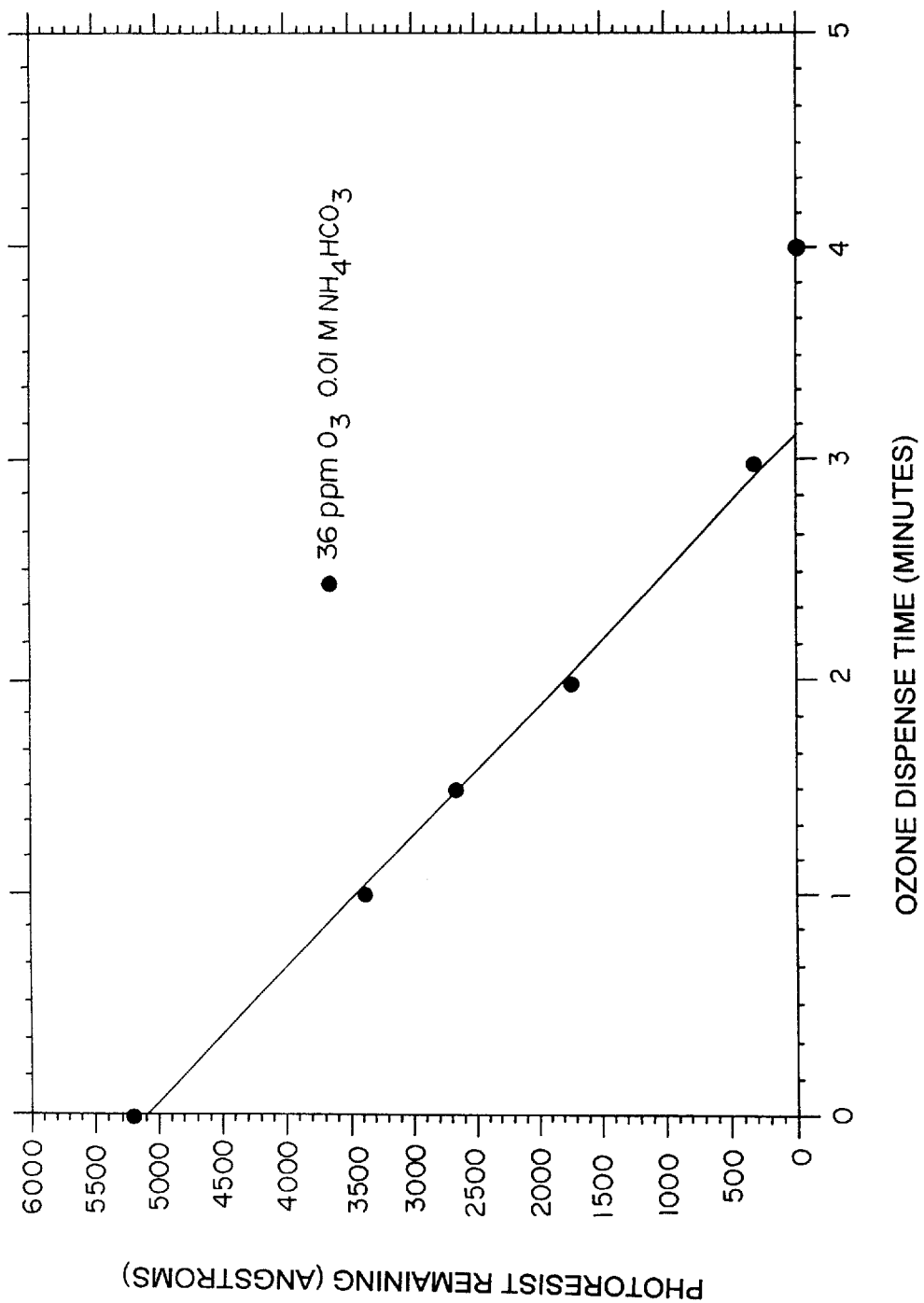
FIG. 6a is a plot showing the amount of photoresist removal from a substrate as a function of time in accordance with Inventive Example 1.
Figure 6B:
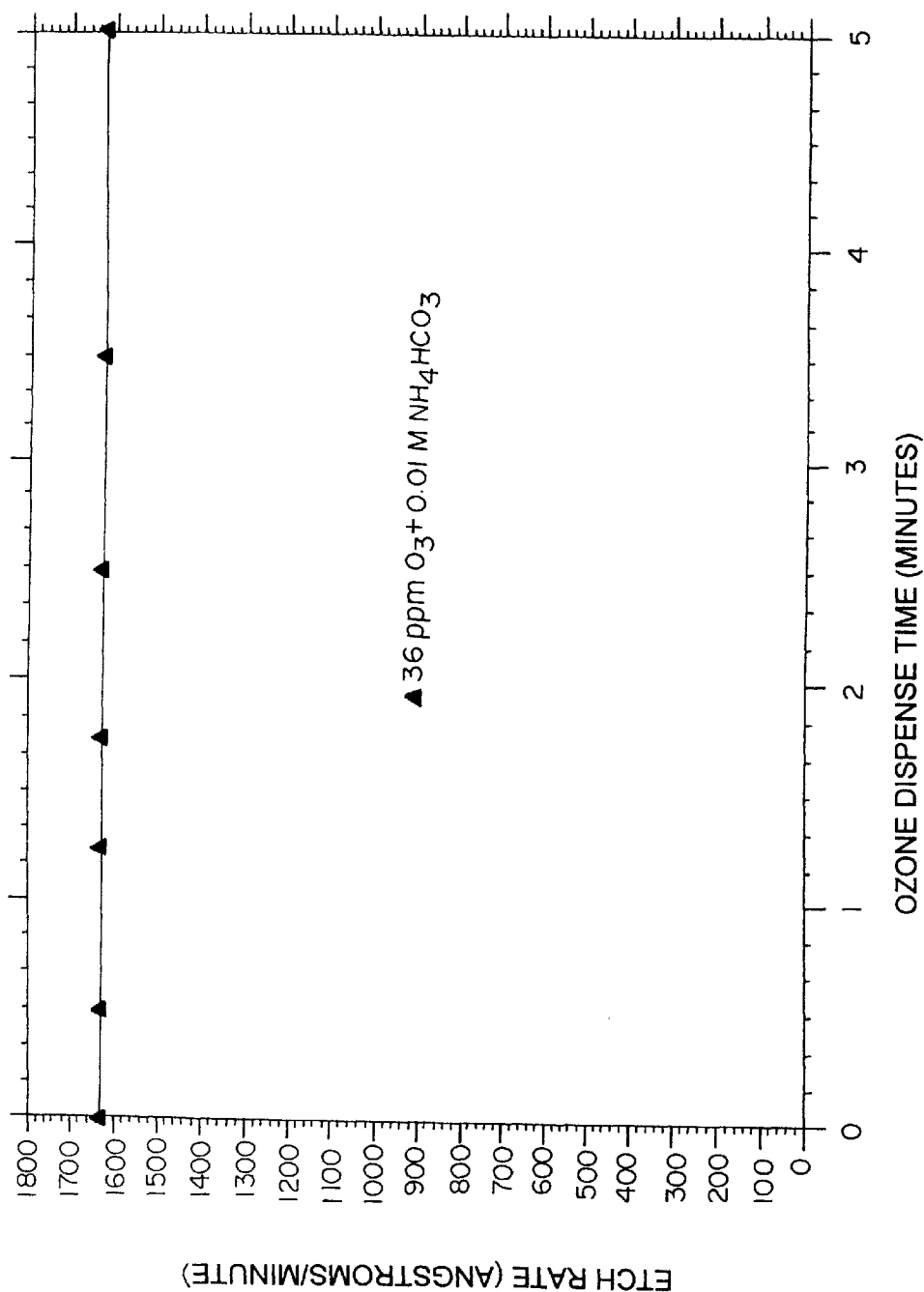
FIG. 6b is a plot showing the photoresist removal rate from the substrate of FIG. 6a as a function of time.

This example, using the present method, demonstrates the improvement resulting from the addition of bicarbonate ion to a solution of ozone in deionized water, as was used in Comparative Example 1. As in Comparative Example 1, 150 mm wafers with a blanket layer of photoresist were used for these experiments. The wafers were treated with 1.32 liters per minute of an aqueous solution containing about $7 \times 10^{-4}$ M ozone (36 ppm), and 0.01 M ammonium bicarbonate. The pH of this solution was slightly basic, with a value near 7.5. The net concentration of bicarbonate ion in solution was approximately $9 \times 10^{-3}$ M, as a result of the conversion of small amounts of bicarbonate ion to either carbonate ion or carbonic acid. FIG. 6a shows the amount of photoresist remaining on the wafer after processing as a function of treatment time while FIG. 6b shows the rate of removal of photoresist. The removal rate is constant, as in Comparative Example 1, but the inventive method results in a roughly 25% faster rate of removal. This benefit continues as the photoresist is removed down to the surface of the wafer, resulting in the complete removal of all photoresist from the wafer in 25% less time.

Comparative Example 2

Figure 7A:
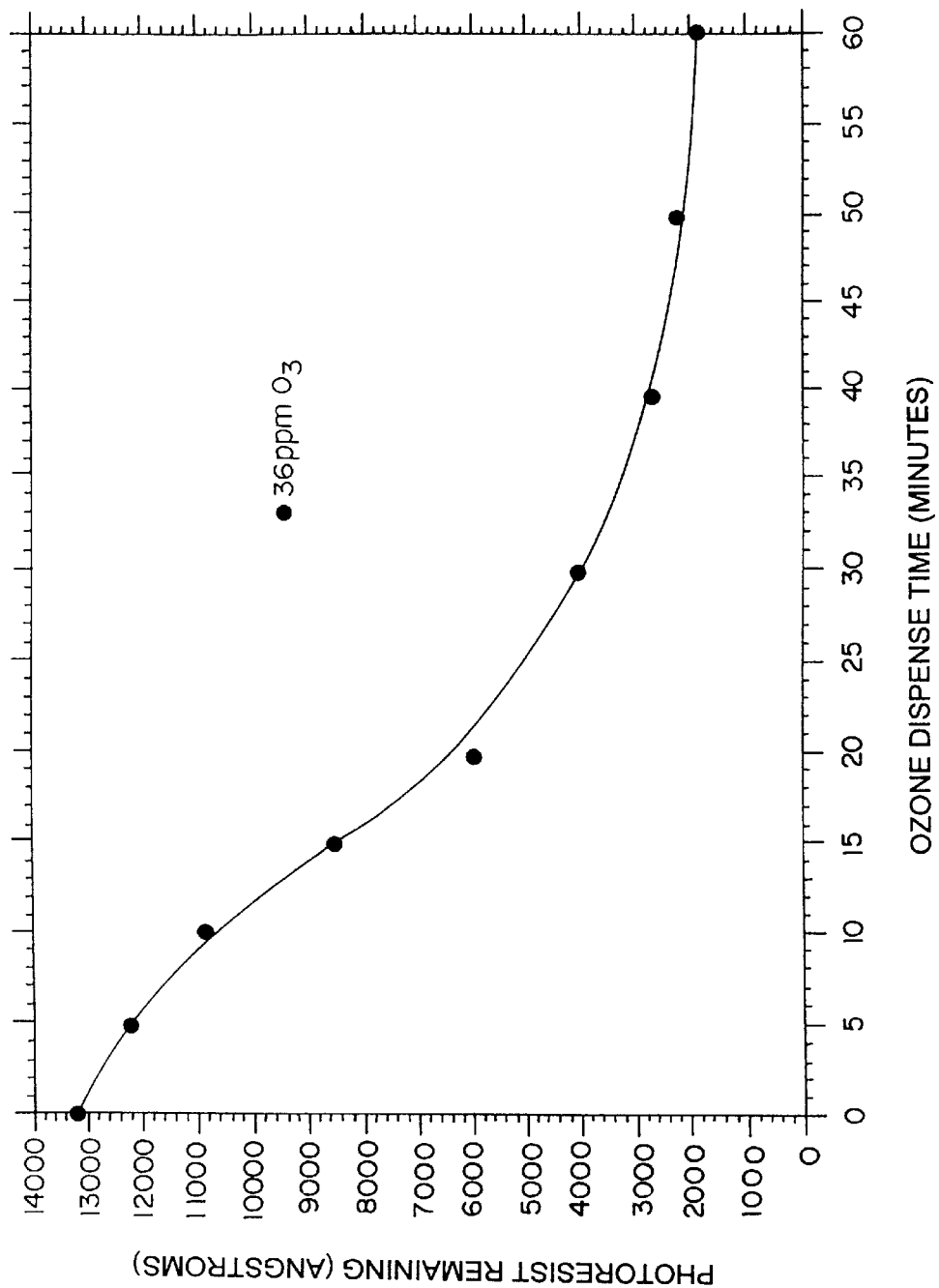
FIG. 7a is a plot showing the amount of photoresist removal from a substrate as a function of time in accordance with Comparative Example 2.
Figure 7B:
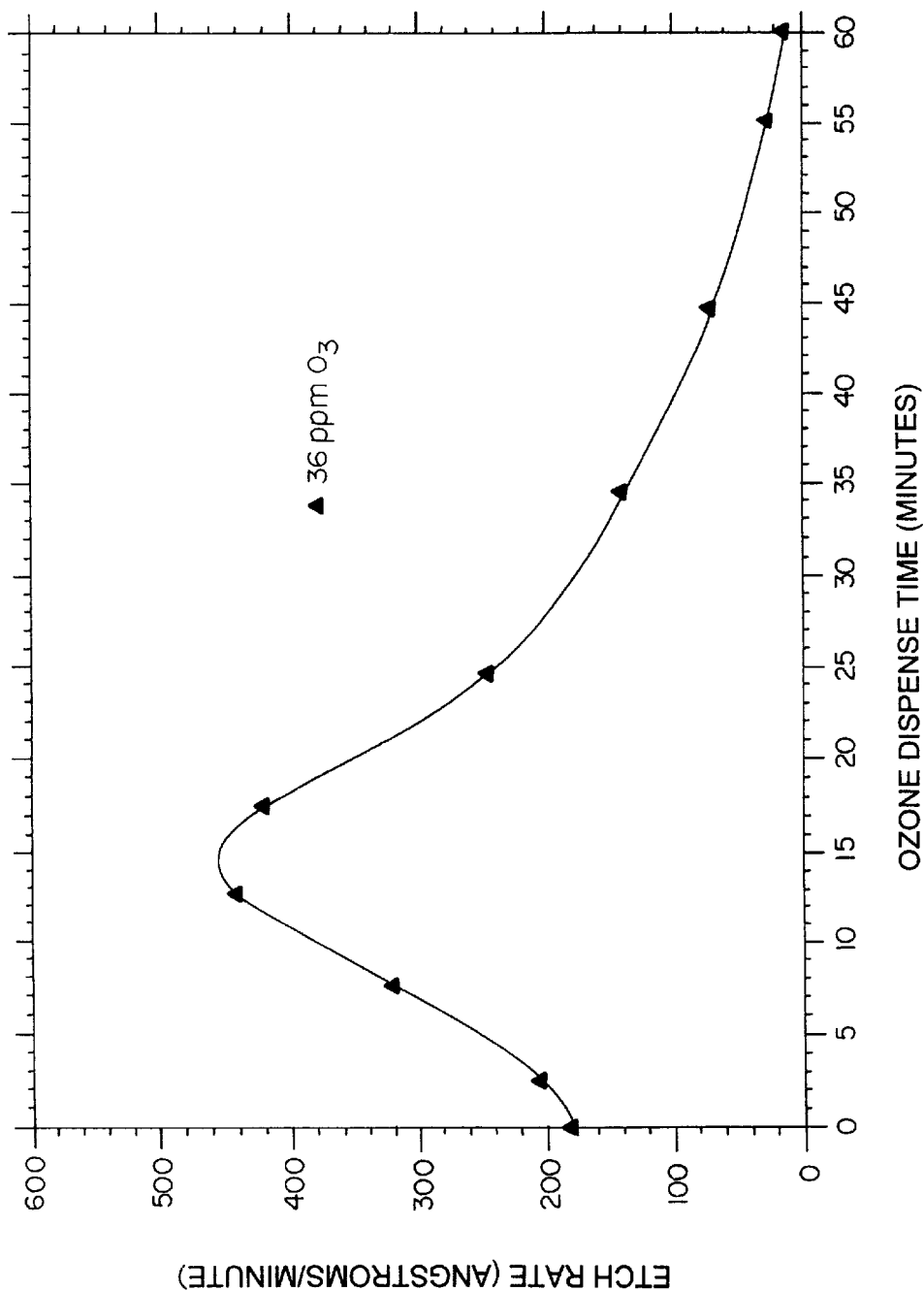
FIG. 7b is a plot showing the photoresist removal rate from the substrate of FIG. 7a as a function of time.

FIG. 7a shows the amount of photoresist remaining on a patterned substrate with exposed aluminum lines as a function of processing time. The preparation history of these wafers includes deposition of a blanket photoresist layer over a blanket aluminum layer, patterning of the photoresist layer, and wet etching of the aluminum exposed when the photoresist was patterned. The resulting surface consists of lines which are several hundreds of micrometers wide consisting of 1.3 micrometers of photoresist resting on 2 micrometers of aluminum. These lines rest on a silicon substrate. Once again the surface was treated with 1.32 liters per minute of 36 ppm ozonated water. The ozonated water was diluted with deionized water from a canister. This sample shows substantially different behavior than the substrates in the previous comparative examples. Rather than the constant removal rate found for the substrates in Inventive Example 1, FIG. 7b shows that the removal rate goes through an initial peak after a few minutes of processing followed by a steady decline in removal rate until the rate is almost zero.

The presence of the aluminum lines on the substrate results in slower removal rates for the photoresist over the entire surface of the substrate. As depicted in FIG. 7a, photoresist remains on the surface even after 60 minutes of processing. Although the removal rate has not decreased to zero, FIG. 7b shows that it is sufficiently slow to render this method unusable for practical applications.

Inventive Example 2

Figure 8A:
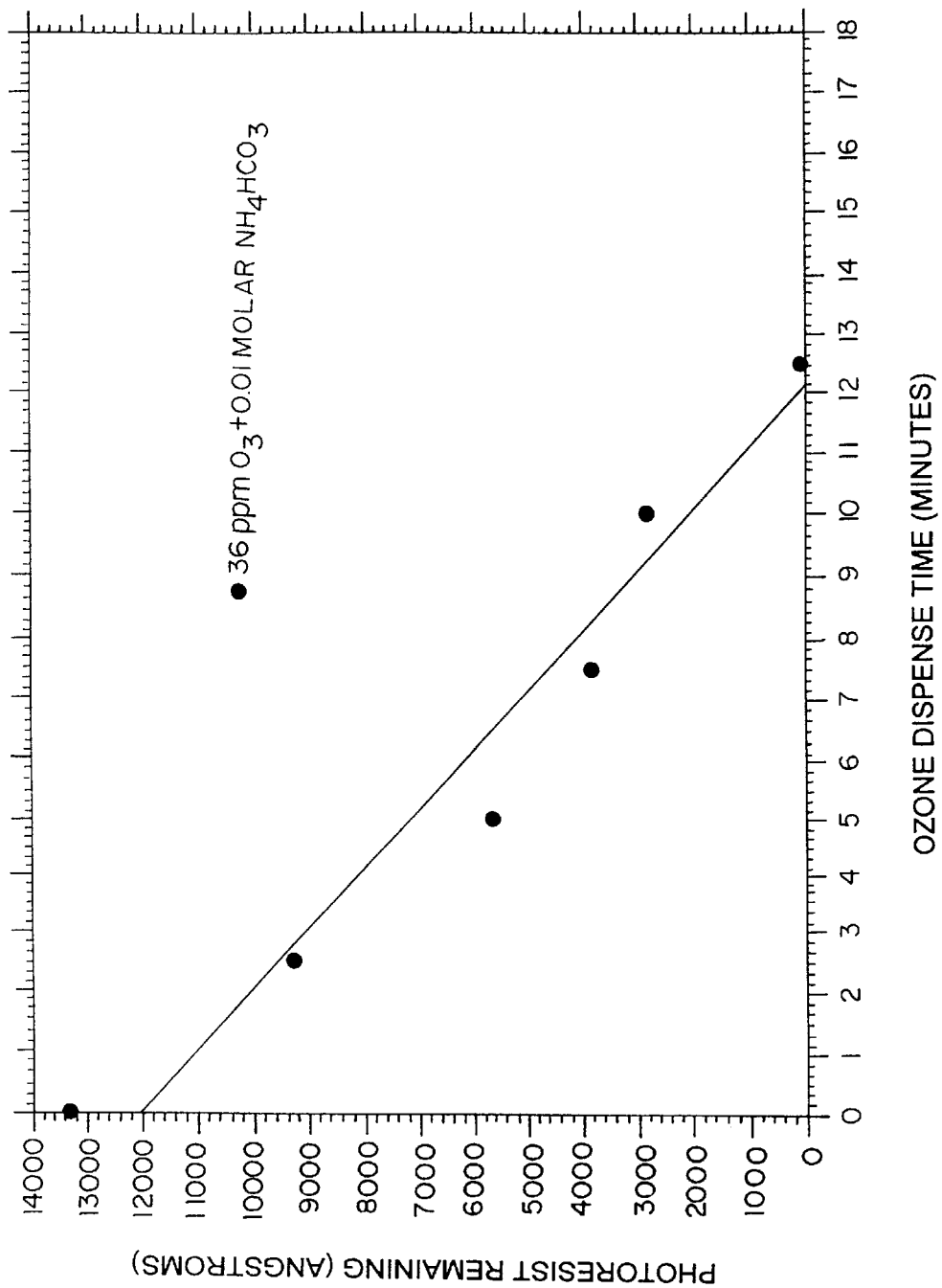
FIG. 8a is a plot showing the amount of photoresist removal from a substrate as a function of time in accordance with Inventive Example 2.
Figure 8B:
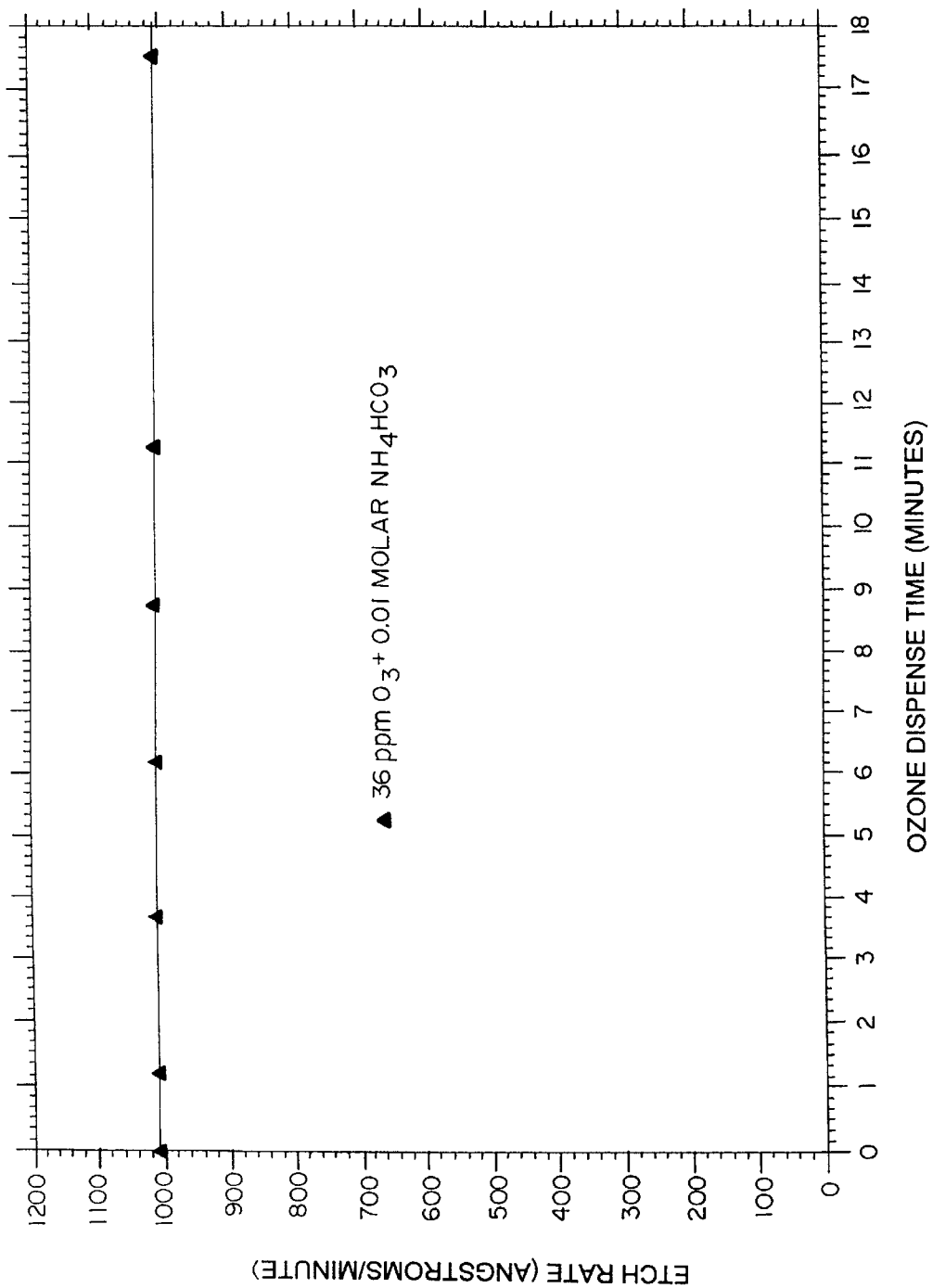
FIG. 8b is a plot showing the photoresist removal rate from the substrate of FIG. 8a as a function of time.

FIG. 8a displays the amount of photoresist remaining on a patterned substrate with exposed aluminum lines after treatment with the inventive method. These sample chips were processed with a total flow of 1.32 liters per minute of water, resulting in an ozone concentration of 36 ppm. The solution also contained 0.01 M ammonium bicarbonate (NH$_4$HCO$_3$). At pH 7.5, this leads to a concentration of bicarbonate ion (HCO$_3^-$) of 9×10$^{-3}$, which is roughly 10 times greater than the ozone concentration. As seen in FIG. 8b, the removal rate is lower than the rates observed for stripping of hard-baked photoresist from silicon surfaces. However, the rate is fairly constant and all of the photoresist is removed from the wafer after less than 15 minutes of processing.

The much higher photoresist removal rates observed when ammonium bicarbonate is added are believed to be due to the radical scavenging properties of the bicarbonate ion, HCO$_{3-}$. Both carbonate (CO$_3^{2-}$) and bicarbonate ions are known radical scavengers. The bicarbonate ions compete with other dissolved ozone molecules to react with the OH radicals. If the bicarbonate ions are present in sufficient quantities, the reaction between the bicarbonate ions and the OH radicals will dominate. The product of the bicarbonate ion and OH radical reaction is relatively inert, preventing any further consumption of ozone.

Finally, the initial rise in removal rate observed in FIGS. 7a and 7b of Comparative Example 2 for removal of photoresist with ozonated water only is believed to represent aluminum contamination present in the upper layers of the resist that was left behind at the end of the aluminum wet etch process. This aluminum contamination exists only in the first hundred or so angstroms of the photoresist and provides an additional source of aluminum for catalyzing the breakdown of ozone molecules. As the upper layers of the resist are attacked by the ozone, this aluminum contamination is washed away, leaving the exposed aluminum lines on the substrate surface as the only locations of aluminum contamination.

To further understand the influence of ammonium bicarbonate on photoresist removal in the presence of metal lines, the concentration of ammonium bicarbonate was varied in Inventive Examples 3–4 while the ozone concentration was held at 36 ppm (8×10$^{-4}$ M).

Inventive Example 3

In this experiment, the ammonium bicarbonate concentration was reduced to 2×10$^{-3}$ M, leading to an effective bicarbonate ion concentration at pH 7.5 of about 1.8×10$^{-3}$ M, or about a factor of two greater than the ozone concentration.

Figure 9A:
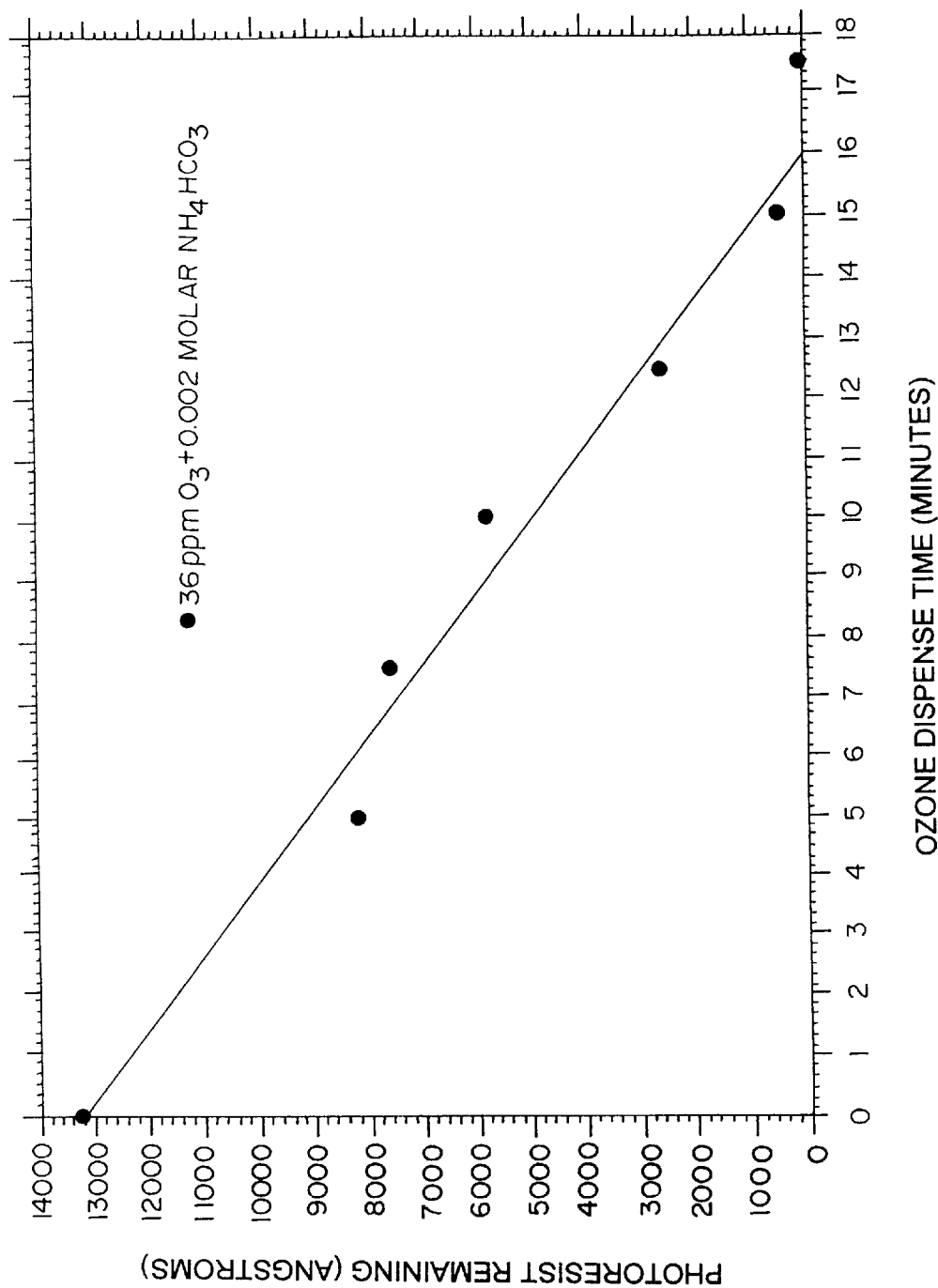
FIG. 9a is a plot showing the amount of photoresist removal from a substrate as a function of time in accordance with Inventive Example 3.
Figure 9B:
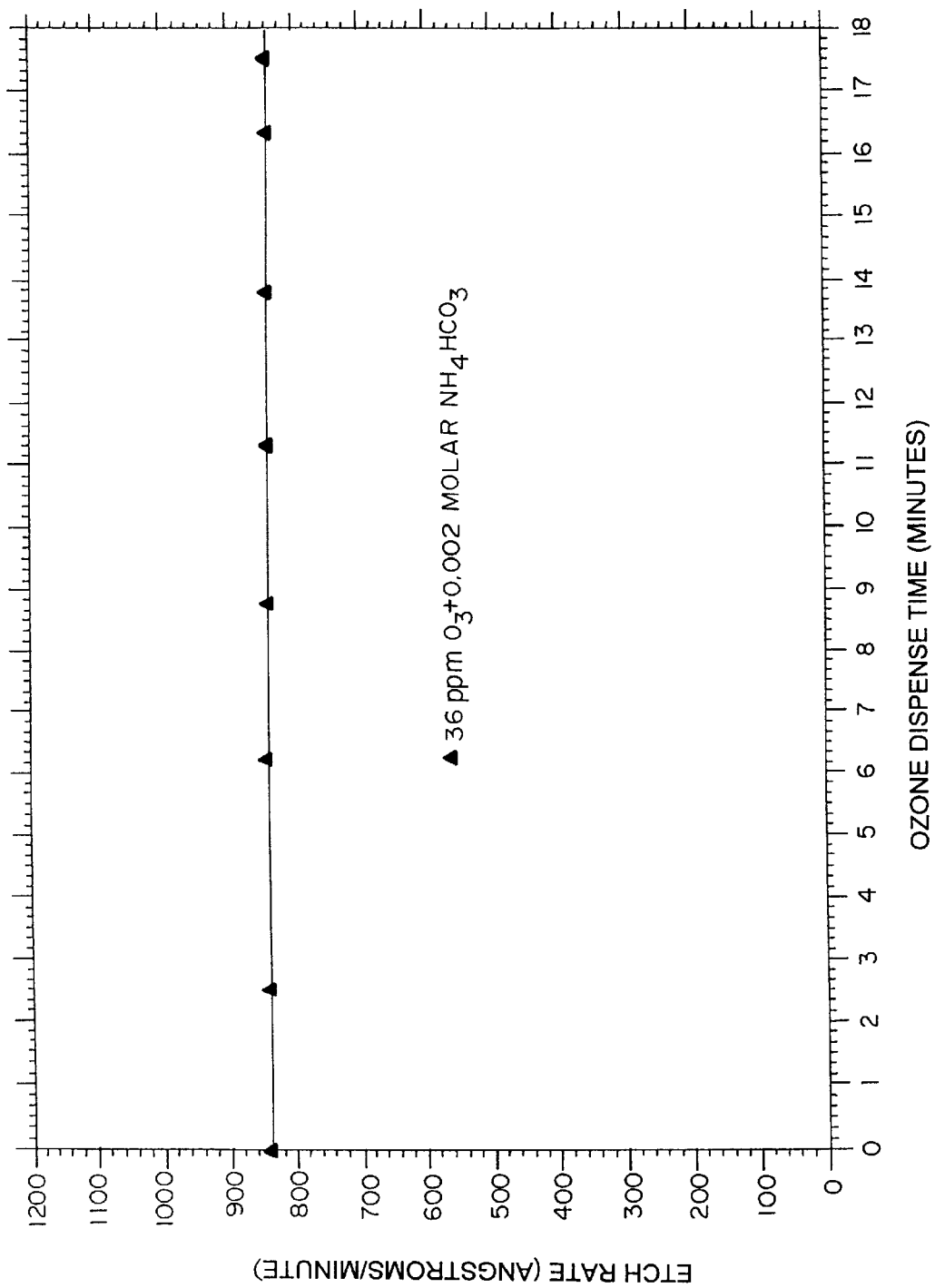
FIG. 9b is a plot showing the photoresist removal rate from the substrate of FIG. 9a as a function of time.

FIG. 9a displays results for the amount of photoresist remaining on the surface after various processing times. As was the case for higher bicarbonate ion concentration of 9×10$^{-3}$ M, the amount of resist still on the surface decreases linearly with time. The rate of removal in FIG. 9b, however, is 20–25% lower than in the higher concentration case.

As noted above, the rate of reaction between OH radicals and bicarbonate ions is similar to the rate of reaction between OH radicals and O$_3$. With similar concentrations of bicarbonate ions and ozone molecules, it is believed that the ozone molecules compete effectively with the bicarbonate ions for reaction with the OH radicals. As a result, a portion of the ozone molecules which do not come into direct contact with the aluminum lines are consumed, leading to a reduction in the photoresist removal rate.

Inventive Example 4

Figure 10A:
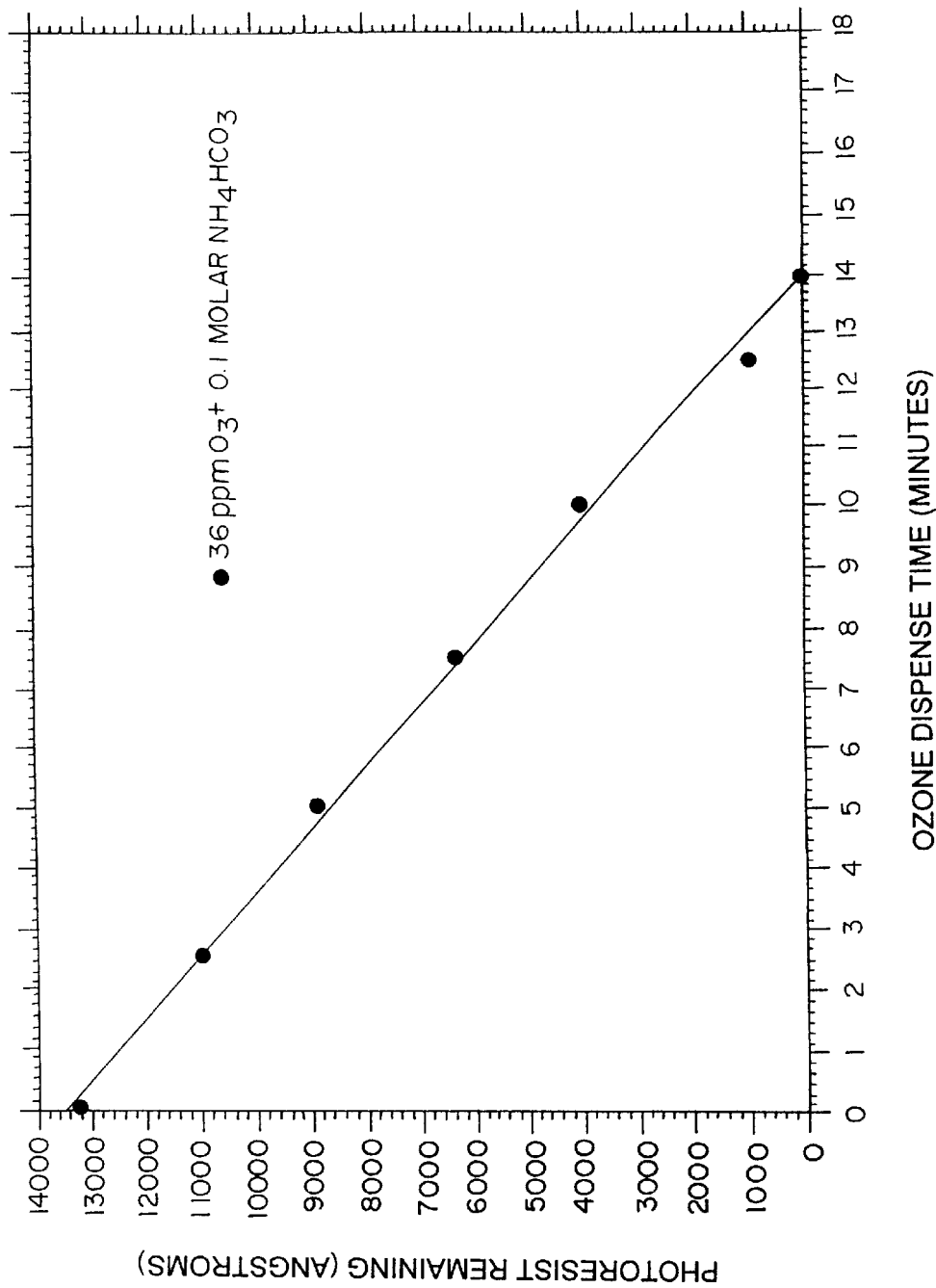
FIG. 10a is a plot showing the amount of photoresist removal from a substrate as a function of time in accordance with Inventive Example 4.

FIG. 10a displays the amount of photoresist remaining on chips with aluminum lines that were treated with 36 ppm ozonated water that also contained 0.1 M ammonium bicarbonate. This corresponds to a bicarbonate ion concentration at pH 7.5 of about 0.09 M, or 100 times as many bicarbonate ions as ozone molecules.

Figure 10B:
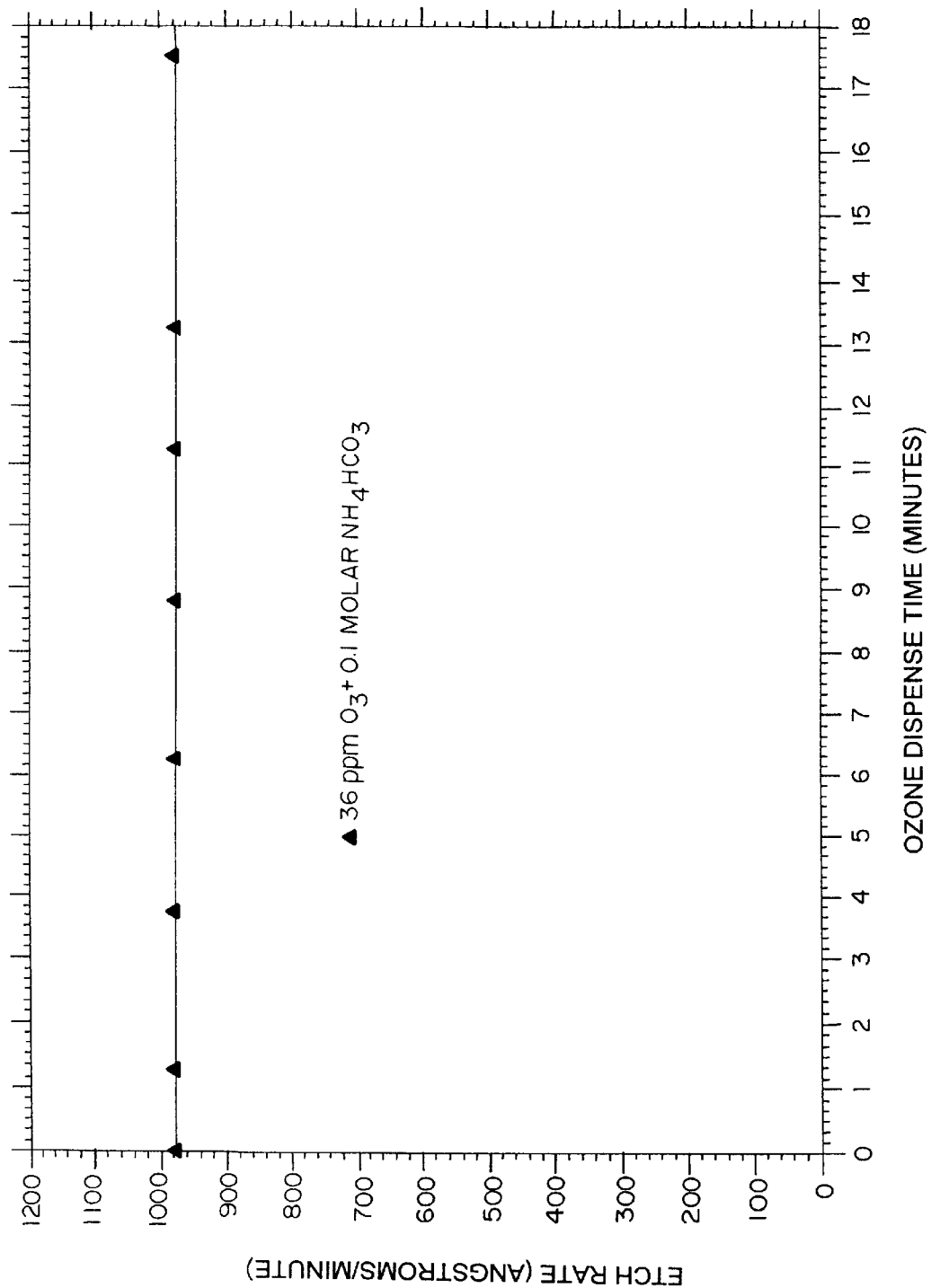
FIG. 10b is a plot showing the photoresist removal rate from the substrate of FIG. 10a as a function of time.

Once again, FIG. 10b shows that the rate of photoresist removal is relatively constant. The overall rate appears to be slightly lower than that observed for the 0.01 M ammonium bicarbonate case. This drop in rate may indicate that the concentration of ammonium ions is high enough for the reaction between ozone and ammonium to become important. However, the drop in rate is small and may not be statistically significant.

Inventive Example 5

The influence of pH on the removal rate of photoresist with the improved method was also investigated. One set of experiments involved reducing the pH to about 6.5 with HF, while another set of experiments investigated solutions with pH values near 9.5. In the latter experiments, NaOH was used to increase the pH of the solution. While NaOH is not acceptable for fabrication processes, use of NaOH allowed for the investigation of the influence of pH without potential interference from high levels of ammonium ions. In both sets of experiments, the improved method showed enhancements of removal rate similar or identical to those described in the prior examples. Thus, the benefits of the improved method are retained for any practical value of the pH.

Comparative Example 3

Figure 11A:
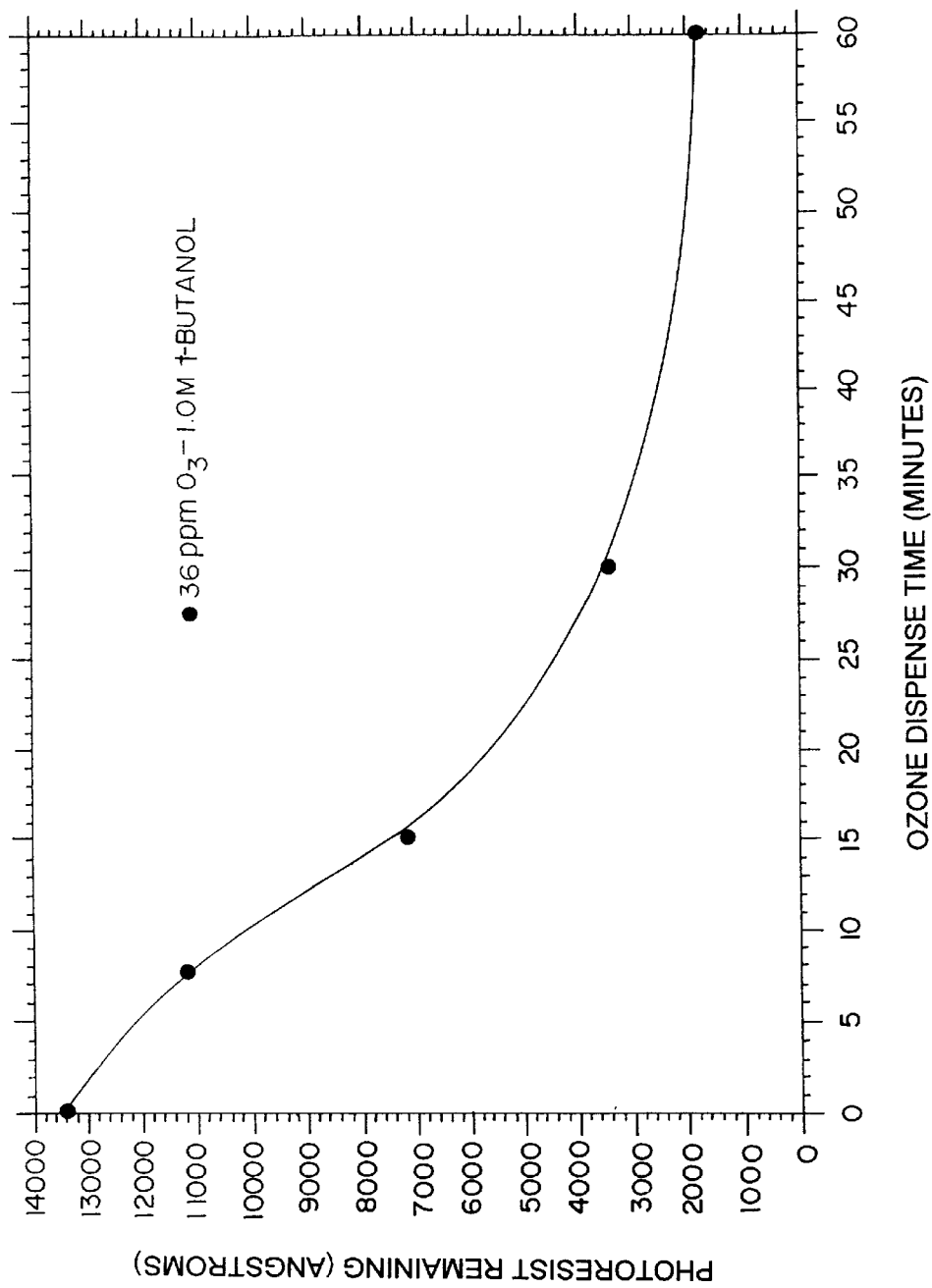
FIG. 11a is a plot showing the amount of photoresist removal from a substrate as a function of time in accordance with Comparative Example 3.
Figure 11B:
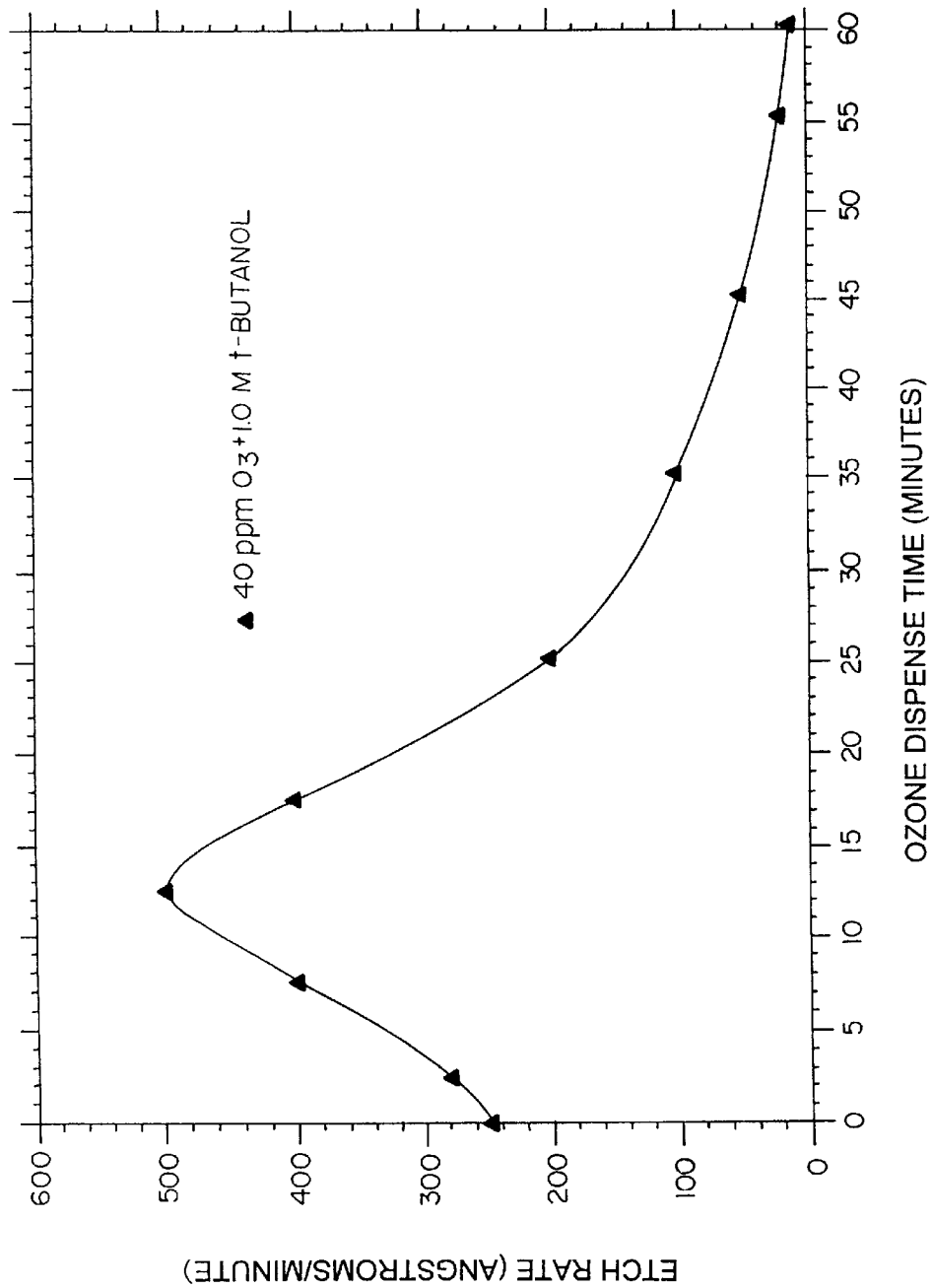
FIG. 11b is a plot showing the photoresist removal rate from the substrate of FIG. 11a as a function of time.

A substrate with both photoresist and exposed aluminum lines was treated with an aqueous solution containing 36 ppm of ozone and a t-butanol concentration of 1.0 M. FIG. 11a shows the amount of photoresist remaining as a function of processing time. When compared to FIG. 7a, where no radical scavenger was added to the ozonated water, it is clear that the presence of the t-butanol has little, if any, impact on the photoresist removal rate. Similarly, FIG. 11b has the same general profile as FIG. 5b, showing once again the lack of influence due to the t-butanol.

Thus, at high radical concentrations the t-butanol does not stop the chain reaction, rather it merely adds extra steps to the sequence.

Comparative Example 4 and Inventive Example 6 that follow illustrate the improvement in photoresist removal rate using the inventive method to remove photoresist from substrates with exposed copper.

Comparative Example 4 and

Inventive Example 6

Figure 12A:
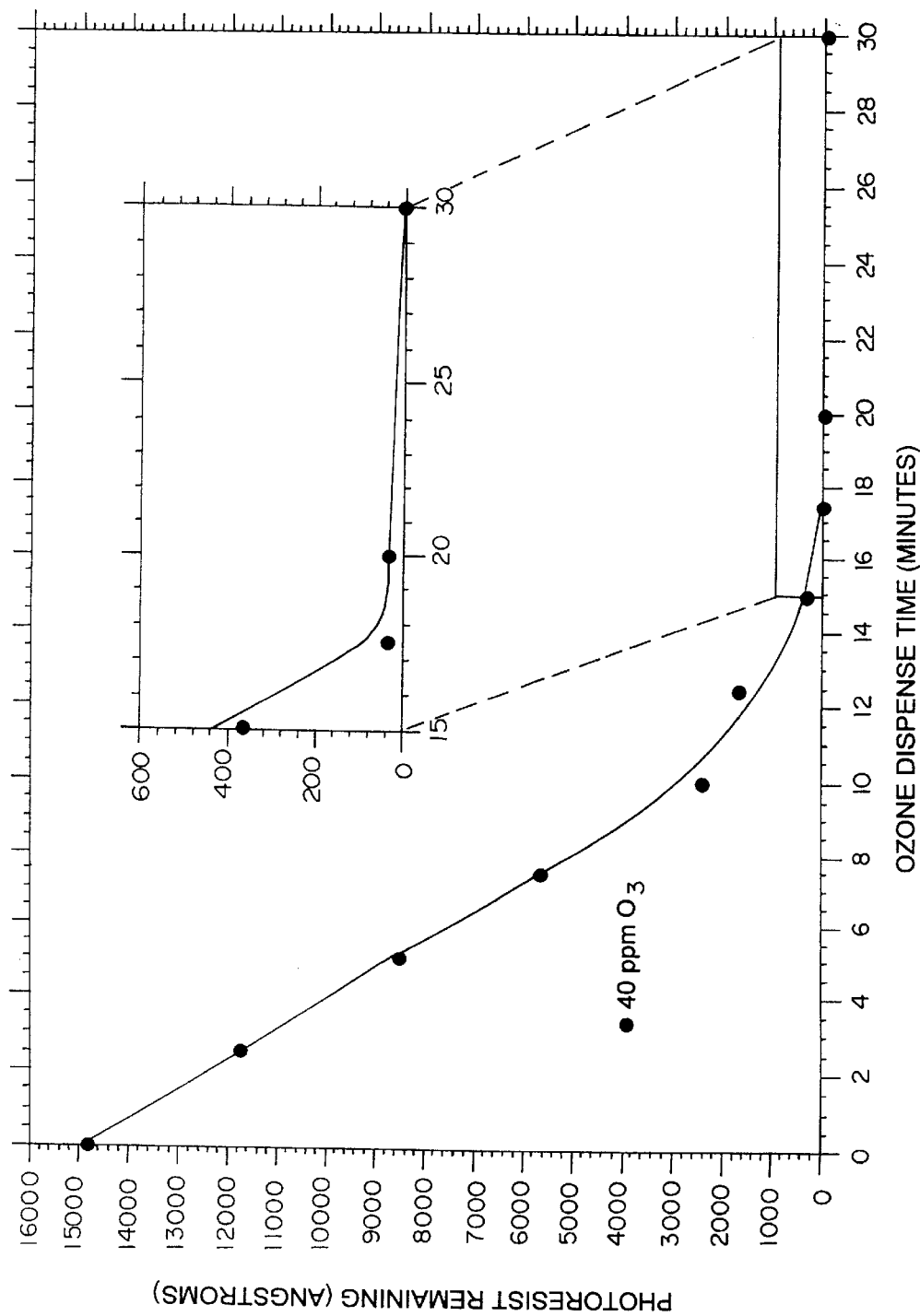
FIG. 12a is a plot showing the amount of photoresist removal from a substrate as a function of time in accordance with Comparative Example 4.
Figure 12B:
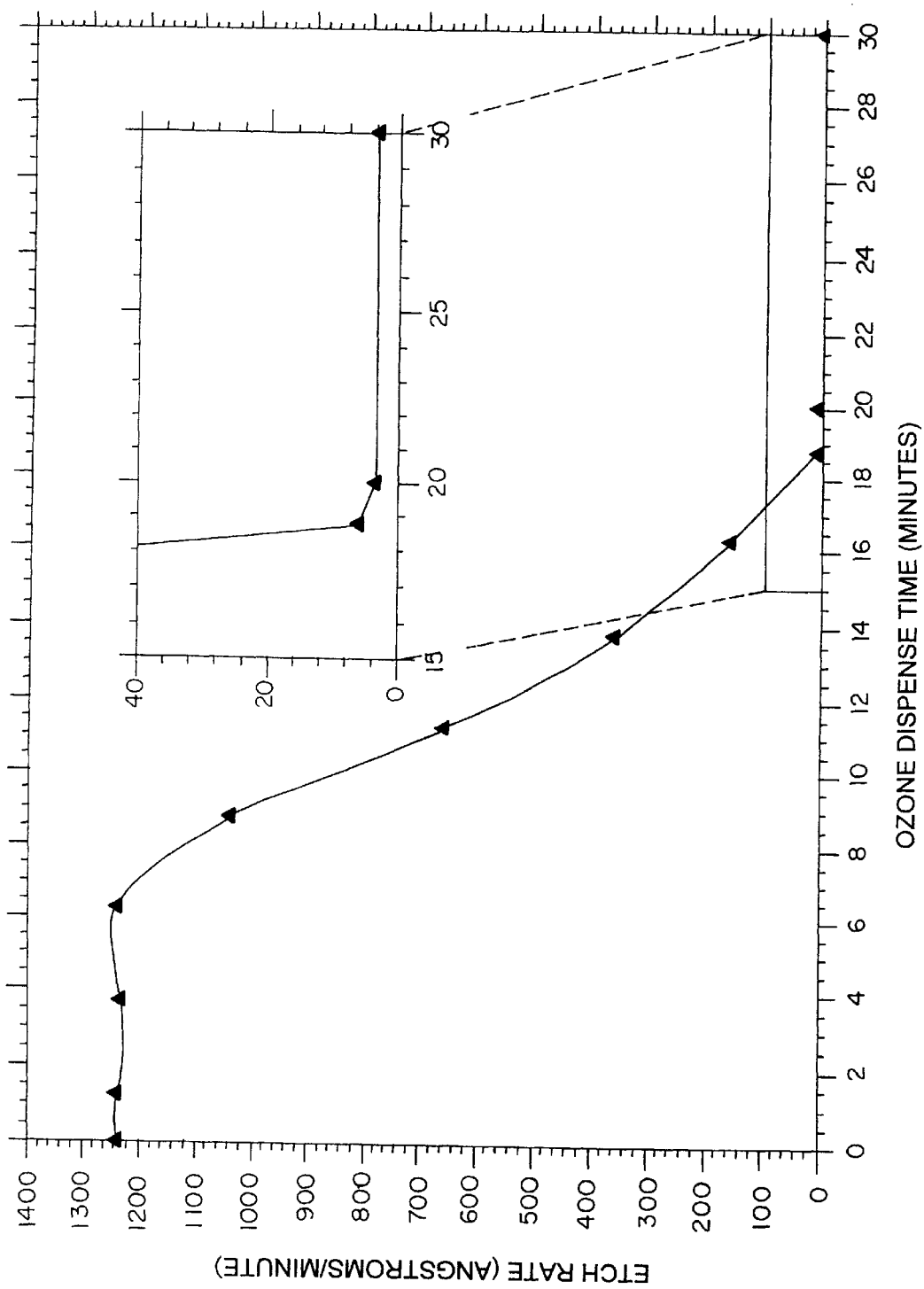
FIG. 12b is a plot showing the photoresist removal rate from the substrate of FIG. 12a as a function of time.
Figure 13A:
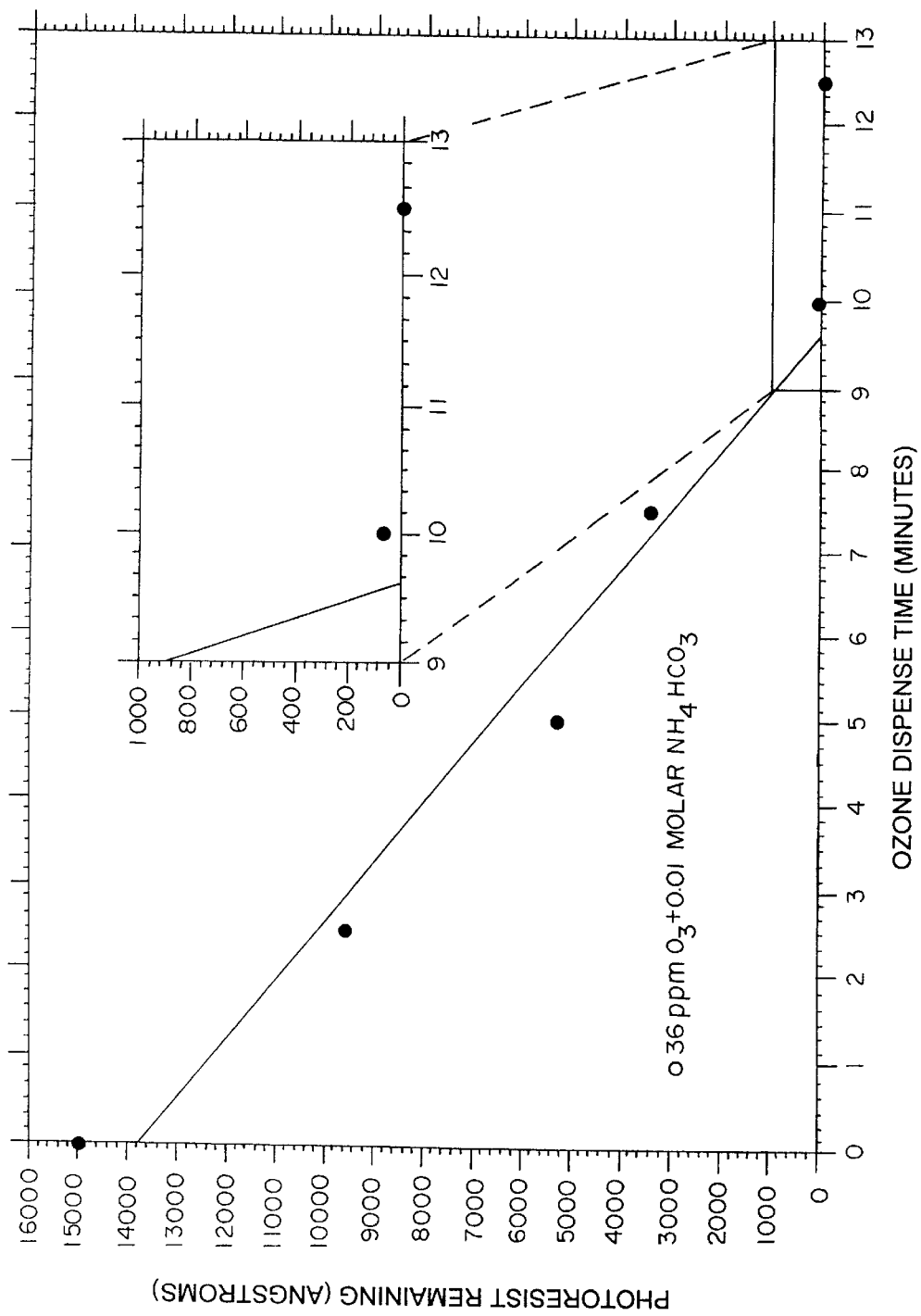
FIG. 13a is a plot showing the amount of photoresist removal from a substrate as a function of time in accordance with Inventive Example 6.
Figure 13B:
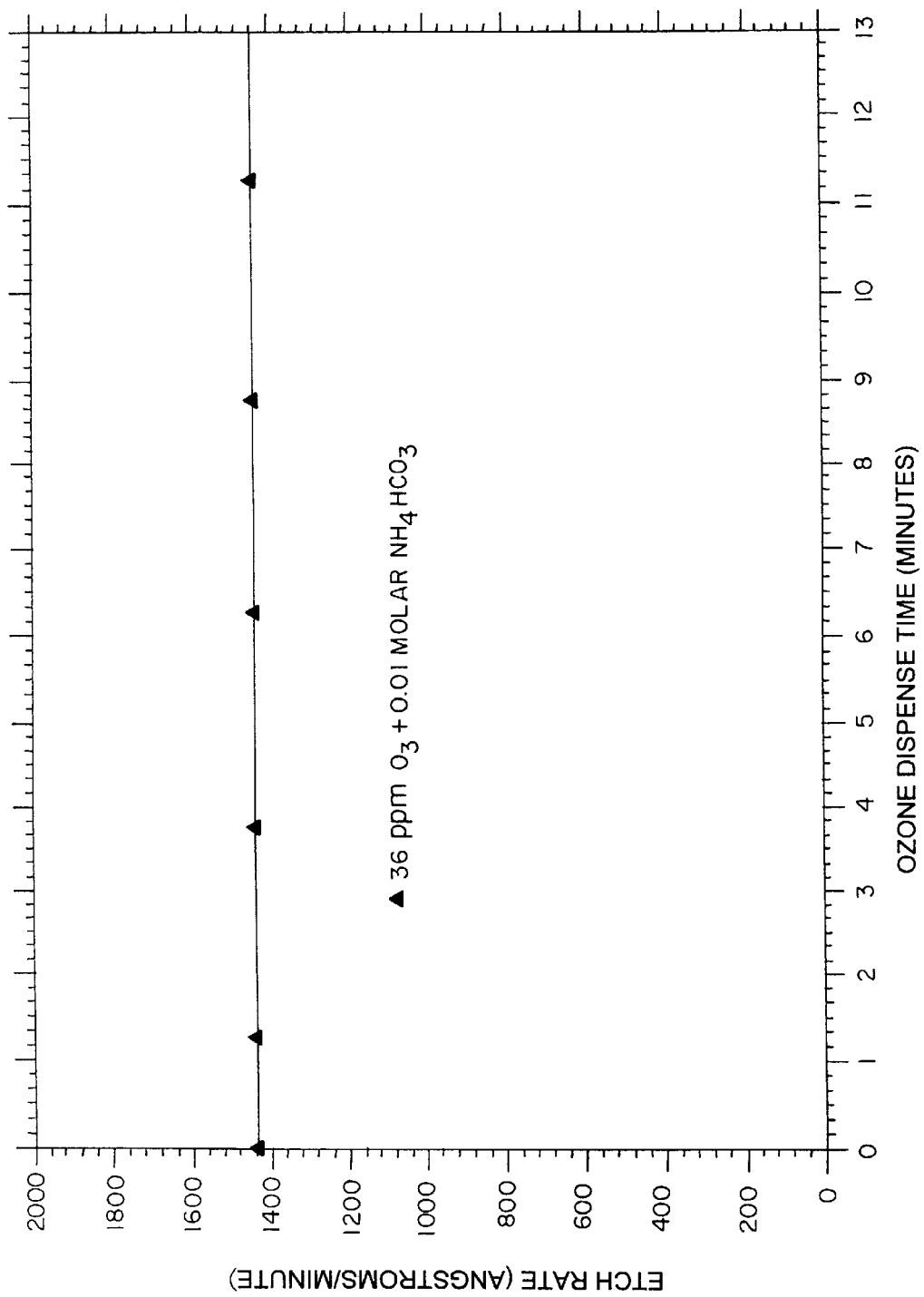
FIG. 13b is a plot showing the photoresist removal rate from the substrate of FIG. 13a as a function of time.

The experimental samples were prepared by cutting sample chips from wafers with a blanket photoresist layer laying on top of a blanket copper layer. The copper was exposed on the sample chips by physically removing the photoresist in a few lines with a width on the order of hundreds of micrometers. The resulting surfaces were treated with i) 1.32 liters per minute of a solution containing only 40 ppm of ozone in water (FIGS. 12a and 12b) and ii) 1.32 liters per minute of a solution containing 36 ppm of ozone and 0.01 M ammonium bicarbonate in water (FIG. 13a). FIGS. 12a and 12b show that initially the removal rate of photoresist is steady at about 1200 Angstroms/minute. However, as the amount of photoresist continues to decrease, the rate of removal drops off. As a result, photoresist is still visibly present on the surface after 20 minutes at a measured height of roughly 30 Angstroms. This final amount of resist is not removed until after 30 minutes of processing. By contrast, FIG. 13a and 13b show relatively effective removal of photoresist until the photoresist layer is completely consumed. The improvement in removal rate due to bicarbonate ion is less dramatic here, but still results in a factor of 2–3 decrease in the time required to completely remove the photoresist. The improvement may be more dramatic on substrates with a larger amount of exposed copper relative to the amount of resist.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

We claim:

1. A method of removing organic material from a substrate having exposed areas of organic material, the substrate for use in an electronic device, comprising the step of:
   spraying the substrate with a treating solution comprising a carrier solvent, ozone, and a source of one or more radical scavengers other than t-butanol and alkanes, wherein the carrier solvent is deionized water.

2. The method of claim 1 wherein the treating solution is sprayed onto the substrate while the substrate is spinning.

3. The method of claim 1 wherein the organic material is photoresist.

4. The method of claim 1 wherein the treating solution further comprises an acid or a base to adjust the pH of the treating solution to a desired pH.

5. The method of claim 1 wherein the source of radical scavenger is a source of bicarbonate and/or carbonate ions.

6. The method of claim 1 wherein the source of radical scavenger is selected from the group consisting of $CO_2$, $H_2CO_3$, $NH_4HCO_3$, $(NH_4)_2CO_3$, salts of bicarbonate ion, salts of carbonate ion, $H_3PO_4$, salts of $H_2PO_4^-$, salts of $HPO_4^{2-}$, salts of $PO_4^{3-}$, acetone and combinations thereof.

7. The method of claim 1 wherein the substrate is treated with a treating solution in a process chamber, the process chamber having a gaseous atmosphere comprising a gas selected from the group consisting of $N_2$, $O_2$, $O_3$, $CO_2$ and combinations thereof.

8. The method of claim 1 wherein the substrate comprises a radical inducing material on at least a portion thereof.

9. The method of claim 1 wherein the ozone is dissolved in the carrier solvent under pressure.

10. A method of removing organic material from a substrate having exposed areas of organic material, the substrate for use in an electronic device, comprising the step of:
    treating the substrate with a treating solution comprising a carrier solvent, ozone, and a source of one or more radical scavengers other than t-butanol and alkanes wherein the ozone is dissolved in the carrier solvent under pressure.

11. The method of claim 10 wherein the treating solution is sprayed onto the substrate.

12. The method of claim 10 wherein the carrier solvent is deionized water.

13. The method of claim 10 wherein the source of radical scavenger is a source of bicarbonate and/or carbonate ions.

14. The method of claim 10 wherein the source of radical scavenger is selected from the group consisting of $CO_2$, $H_2CO_3$, $NH_4HCO_3$, $(NH_4)_2CO_3$, salts of bicarbonate ion, salts of carbonate ion, $H_3PO_4$, salts of $H_2PO_4^-$, salts of $HPO_4^{2-}$, salts of $PO_4^{3-}$, acetone and combinations thereof.

15. A method of removing organic material from a substrate having exposed areas of organic material, the substrate for use in an electronic device, comprising the step of:
    spraying the substrate with a treating solution comprising a carrier solvent, ozone, and a source of bicarbonate and/or carbonate ions, wherein the carrier solvent is deionized water.

16. The method of claim 15 wherein the ozone is dissolved in the carrier solvent under pressure.

17. The method of claim 15 wherein the substrate is treated with a treating solution in a precess chamber, the process chamber having a gaseous atmosphere comprising a gas selected from the group consisting of $N_2$, $O_2$, $O_3$, $CO_2$ and combinations thereof.

18. The method of claim 15 wherein the substrate comprises a radical inducing material on at least a portion thereof.

19. A method of removing organic material from a substrate having exposed areas of organic material, the substrate for use in an electronic device, comprising the step of:
    treating the substrate with a treating solution obtained by a process consisting essentially of dissolving ozone and a source of one or more radical scavengers other than t-butanol and alkanes in a solvent.

20. A method as in claim 19 wherein said treating solution has a pH of 5 to 10.

21. A method as in claim 19 wherein the treating solution has a pH of 6 to 13.

22. A method as in claim 19 wherein the treating solution has a pH of 7 to 8.5.

23. A method as in claim 19 wherein the radical scavenger has a concentration in the treating solution which is at least 1.5 times the concentration of ozone.

24. A method as in claim 23 wherein the radical scavenger has a concentration in the treating solution which is from 5 to 20 times the concentration of ozone.

25. A method as in claim 19 wherein the radical scavenger a source of bicarbonate and/or carbonate ions.

26. A method as in claim 19 wherein the solvent is deionized water.

* * * * *